US011063219B2

(12) United States Patent
Inokuchi et al.

(10) Patent No.: US 11,063,219 B2
(45) Date of Patent: Jul. 13, 2021

(54) ORGANIC PHOTOELECTRIC CONVERSION ELEMENT, AND SOLAR CELL MODULE AND SENSOR PROVIDED WITH THE SAME

(71) Applicant: SUMITOMO CHEMICAL COMPANY, LIMITED, Tokyo (JP)

(72) Inventors: Daisuke Inokuchi, Osaka (JP); Ryoichi Hiraoka, Ibaraki (JP)

(73) Assignee: SUMITOMO CHEMICAL COMPANY, LIMITED, Tokyo (JP)

( * ) Notice: Subject to any disclaimer, the term of this patent is extended or adjusted under 35 U.S.C. 154(b) by 69 days.

(21) Appl. No.: 16/088,895

(22) PCT Filed: Mar. 27, 2017

(86) PCT No.: PCT/JP2017/012288
§ 371 (c)(1),
(2) Date: Sep. 27, 2018

(87) PCT Pub. No.: WO2017/170345
PCT Pub. Date: Oct. 5, 2017

(65) Prior Publication Data
US 2019/0115540 A1  Apr. 18, 2019

(30) Foreign Application Priority Data
Mar. 29, 2016 (JP) .............. JP2016-065513

(51) Int. Cl.
H01L 51/00 (2006.01)
H01L 51/44 (2006.01)
C08L 101/02 (2006.01)
C08G 61/12 (2006.01)
C09D 11/102 (2014.01)
C09D 11/52 (2014.01)
H01L 27/30 (2006.01)
H01L 51/42 (2006.01)

(52) U.S. Cl.
CPC ........ H01L 51/0036 (2013.01); C08G 61/126 (2013.01); C08L 101/02 (2013.01); C09D 11/102 (2013.01); C09D 11/52 (2013.01); H01L 51/0003 (2013.01); H01L 51/0004 (2013.01); H01L 51/0047 (2013.01); H01L 51/0097 (2013.01); H01L 51/44 (2013.01); C08G 2261/124 (2013.01); C08G 2261/228 (2013.01); C08G 2261/3242 (2013.01); C08G 2261/3243 (2013.01); C08G 2261/3246 (2013.01); C08G 2261/51 (2013.01); C08G 2261/91 (2013.01); C08G 2261/94 (2013.01); H01L 27/307 (2013.01); H01L 51/42 (2013.01); H01L 51/4253 (2013.01); Y02E 10/549 (2013.01)

(58) Field of Classification Search
CPC . H01L 51/0036; H01L 51/44; H01L 51/0003; H01L 51/0004; H01L 51/0047; H01L 51/0097; H01L 27/307; H01L 51/42; H01L 51/4253; H01L 51/442; H01L 51/0043; C08L 101/02; C08G 61/126; C08G 2261/124; C08G 2261/228; C08G 2261/3242; C08G 2261/3243; C08G 2261/3246; C08G 2261/51; C08G 2261/91; C08G 2261/94; C08G 2261/1412; C08G 2261/12; C08G 2261/794; C08G 2261/344; C08G 2261/146; C08G 2261/3223; C08G 2261/1424; C09D 11/102; C09D 11/52; C09D 133/066; C09D 165/00; Y02E 10/549
USPC ....... 252/500, 75; 257/40; 136/263; 524/547
See application file for complete search history.

(56) References Cited

U.S. PATENT DOCUMENTS 9,512,149 B2 * 12/2016 Ohya .................. C07F 5/04
9,722,180 B2    8/2017 Lafalce et al.
9,941,422 B2    4/2018 Okubo et al.
10,719,284 B2 * 7/2020 Yamazaki ............ G06F 1/1652
2014/0239284 A1 8/2014 Yoshimura et al.
2015/0096610 A1 4/2015 Okubo et al.
(Continued)

FOREIGN PATENT DOCUMENTS

JP  2011-524463 A  9/2011
JP  2012-018957 A  1/2012
(Continued)

OTHER PUBLICATIONS

Kirill Zilberberg et al., "Highly Robust Indium-Free Transparent Conductive Electrodes Based on Composites of Silver Nanowires and Conductive Metal Oxides", Advanced Functional Materials, 2014, pp. 1671-1678, vol. 24.
(Continued)

Primary Examiner — Douglas J McGinty
(74) Attorney, Agent, or Firm — Sughrue Mion, PLLC

(57) ABSTRACT

An object is to provide an organic photoelectric conversion element having high durability. The present invention provides an organic photoelectric conversion element having an active layer between a cathode and an anode, characterized in that, the organic photoelectric conversion element includes a layer including a cured product obtained by curing a thermosetting resin composition between the anode and the active layer, and a transmittance of light with a wavelength of 380 nm to 780 nm is 10% or higher. The present invention provides the organic photoelectric conversion element in which the thermosetting resin composition includes one or more selected from the group consisting of polythiophene and derivatives thereof and a polymer compound including a repeating unit having an aromatic amine residue.

6 Claims, No Drawings

(56) References Cited

U.S. PATENT DOCUMENTS

| 2015/0144200 A1* | 5/2015 | Iketaki | C08G 61/123 |
| | | | 136/263 |
| 2016/0111669 A1 | 4/2016 | Uetani | |
| 2017/0229667 A1 | 8/2017 | Uetani | |

FOREIGN PATENT DOCUMENTS

| JP | 2012-186310 A | 9/2012 | |
| JP | 5700044 B2 | 4/2015 | |
| JP | 2016-082242 A | 5/2016 | |
| WO | 2009/136863 A1 | 11/2009 | |
| WO | 2012/005116 A1 | 1/2012 | |
| WO | 2012/121937 A1 | 9/2012 | |
| WO | 2013/051676 A1 | 4/2013 | |
| WO | 2013/151141 A1 | 10/2013 | |
| WO | WO-2013183549 A1 * | 12/2013 | ............. B82Y 10/00 |
| WO | 2014/145609 A1 | 9/2014 | |
| WO | 2016/063781 A1 | 4/2016 | |

OTHER PUBLICATIONS

Yinhua Zhou et al., "Indium tin oxide-free and metal-free semi-transparent organic solar cells", Applied Physics Letters, Oct. 2010, pp. 153304-1-153304-3, vol. 97.

Dean M. Delongchamp et al., "Influence of a Water Rinse and the Structure and Properties of Poly(3,4-ethylenedioxythiophene):Poly(styrene sulfonate) Films", Langmuir, Oct. 28, 2005, pp. 11480-11483, vol. 21, No. 24.

International Search Report for PCT/JP2017/012288 dated Jun. 20, 2017 [PCT/ISA/210].

Communication dated Nov. 6, 2019 from European Patent Office in counterpart EP Application No. 17774882.9.

English Translation of WO 2012/005116 published on Jan. 12, 2012.

Office Action dated Apr. 6, 2021 in Japanese Application No. 2018-509317.

* cited by examiner

ORGANIC PHOTOELECTRIC CONVERSION ELEMENT, AND SOLAR CELL MODULE AND SENSOR PROVIDED WITH THE SAME

CROSS REFERENCE TO RELATED APPLICATIONS

This application is a National Stage of International Application No. PCT/JP2017/012288 filed Mar. 27, 2017, claiming priority based on Japanese Patent Application No. 2016-065513 filed Mar. 29, 2016.

TECHNICAL FIELD

The present invention relates to an organic photoelectric conversion element, a solar cell module and a sensor provided with the organic photoelectric conversion element.

BACKGROUND ART

Organic photoelectric conversion elements having an active layer comprising an organic compound have a wide range of options for element configuration, enable production of flexible transparent solar cell modules and visible light transmitting solar cells, for example, and are attracting attention as a new technique that can respond to various needs depending on use environments.

Reported is a transparent organic photoelectric conversion element that has an active layer comprising P3HT and $C_{60}$ PCBM and does not have a layer comprising a cured product obtained by curing a thermosetting resin composition, for example (Non Patent Document 1).

RELATED ART DOCUMENTS

Non Patent Document 1: Adv. Funct. Mater. 2014, 24, p. 1671-1678

DISCLOSURE OF INVENTION

Problem to be Solved by the Invention

However, the photoelectric conversion element described in Non Patent Document 1 does not necessarily have sufficient durability.

Therefore, an object of the present invention is to provide an organic photoelectric conversion element having high durability.

Means for Solving Problem

An aspect of the present invention relates to the following organic photoelectric conversion element.
[1]
An organic photoelectric conversion element having an active layer between a cathode and an anode, characterized in that,
the organic photoelectric conversion element comprises a layer comprising a cured product obtained by curing a thermosetting resin composition between the anode and the active layer, and
a transmittance of light with a wavelength of 380 nm to 780 nm is 10% or higher.
[2]
The organic photoelectric conversion element according to [1], wherein the thermosetting resin composition comprises one or more selected from the group consisting of polythiophene and derivatives thereof, and a polymer compound comprising a repeating unit having an aromatic amine residue.
[3]
The organic photoelectric conversion element according to [1] or [2], wherein the layer comprising a cured product obtained by curing a thermosetting resin composition has an ionization energy change before and after water rinsing treatment of −0.1 eV or higher and 0.1 eV or lower in the measurement of ionization energy before and after the following water rinsing treatment:
<Measurement of Ionization Energy before and after Water Rinsing Treatment>
Two films for ionization energy measurement are formed.
The films for ionization energy measurement are each made by a substantially same method as that of the layer comprising a cured product obtained by curing a thermosetting resin composition
using substantially same materials as those of the layer comprising a cured product obtained by curing a thermosetting resin composition of the organic photoelectric conversion element of the present invention
on a one-by-one-inch square supporting substrate.
The films for ionization energy measurement each have a substantially same thickness as that of the layer comprising a cured product obtained by curing a thermosetting resin composition.
For one of the films for ionization energy measurement, ionization energy is measured with a photoelectron spectrometer, and an obtained value is defined as ionization energy before water rinsing treatment. Water is placed on the other of the films for ionization energy measurement so as to form a meniscus, and after being left at rest for 10 seconds, spinning is performed with a spin coater at 4,000 rpm for 30 seconds to shake off the water, whereby water rinsing treatment is performed. For the film for ionization energy measurement after the water rinsing treatment, ionization energy is measured with a photoelectron spectrometer, and an obtained value is defined as ionization energy after water rinsing treatment. The value of (the ionization energy after water rinsing treatment)−(the ionization energy before water rinsing treatment) is defined as an ionization energy change before and after water rinsing treatment.
[4]
The organic photoelectric conversion element according to any one of [1] to [3], wherein the active layer comprises an N-type semiconductor material and a polymer compound as a P-type semiconductor material.
[5]
The organic photoelectric conversion element according to any one of [1] to [4], wherein the polymer compound as a P-type semiconductor material is a polymer compound having a structural unit represented by the following Formula (I) or Formula (II):

[Chemical Formula 1]

$$-Ar^1-Ar^2- \quad (I)$$
$$\underset{Z}{\underbrace{\phantom{XXXX}}}$$

[Chemical Formula 2]

$$\underset{R \quad R}{\times} \quad (Z\text{-}1)$$

-continued

 (Z-2)

 (Z-3)

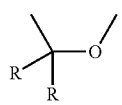 (Z-4)

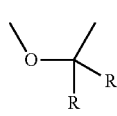 (Z-5)

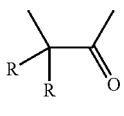 (Z-6)

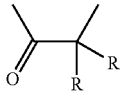 (Z-7)

wherein, in Formula (I), $Ar^1$ and $Ar^2$ each independently represent a trivalent aromatic hydrocarbon group or a trivalent aromatic heterocyclic group, Z represents a divalent group represented by Formula (Z-1), (Z-2), (Z-3), (Z-4), (Z-5), (Z-6), or (Z-7), R represents a hydrogen atom, a halogen atom, an amino group, a cyano group, a monovalent aromatic hydrocarbon group optionally having a substituent, a monovalent heterocyclic group optionally having a substituent, an alkyl group optionally having a substituent, a cycloalkyl group optionally having a substituent, an alkoxy group optionally having a substituent, a cycloalkoxy group optionally having a substituent, an alkylthio group optionally having a substituent, a cycloalkylthio group optionally having a substituent, an aryloxy group optionally having a substituent, an arylthio group optionally having a substituent, an arylalkyl group optionally having a substituent, an arylalkoxy group optionally having a substituent, an arylalkylthio group optionally having a substituent, an acyl group optionally having a substituent, an acyloxy group optionally having a substituent, an amide group optionally having a substituent, an acid imide group optionally having a substituent, a substituted amino group, a substituted silyl group, a substituted silyloxy group, a substituted silylthio group, a heterocyclyloxy group, a heterocyclylthio group, an arylalkenyl group, an arylalkynyl group, or a carboxy group, and The two Rs in Formulae (Z-1), (Z-2), (Z-4), (Z-5), (Z-6), and (Z-7) may be the same as or different from each other;

[Chemical Formula 3]

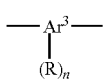 (II)

wherein, in Formula (II), $Ar^3$ represents a divalent fused polycyclic aromatic hydrocarbon group or a divalent fused polycyclic aromatic heterocyclic group having a fused ring in which two or more and five or less rings selected from the group consisting of aromatic rings and heteroaromatic rings are fused, n represents an integer of 1 to 6, R represents the same meaning as the above, and when R is plurally present, they may be the same as or different from each other.

[6]

The organic photoelectric conversion element according to any one of [1] to [5], wherein the structural units represented by Formulae (I) and (II) are a structural unit represented by the following Formula (III) and a structural unit represented by Formula (V), respectively:

[Chemical Formula 4]

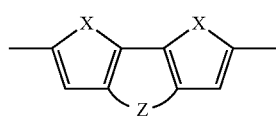 (III)

wherein, in Formula (III),

Z represents the same meaning as the above;

X represents an oxygen atom, a sulfur atom, or a selenium atom; and plurality of Xs may be the same as or different from each other;

[Chemical Formula 5]

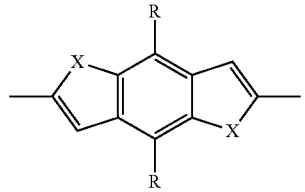 (V)

wherein, in Formula (V),

X and R represent the same meanings as the above;

plurality of Xs may be the same as or different from each other; and plurality of Rs may be the same as or different from each other.

[7]

The organic photoelectric conversion element according to any one of [4] to [6], wherein the N-type semiconductor material has fullerene derivatives.

[8]

A solar cell module comprising the organic photoelectric conversion element according to any one of [1] to [7].

[9]

A sensor comprising the organic photoelectric conversion element according to any one of [1] to [7].

DESCRIPTION OF EMBODIMENTS

The following describes a preferred embodiment of the present invention.

<1> Organic Photoelectric Conversion Element

An organic photoelectric conversion element of the present invention is an organic photoelectric conversion element having an active layer between a cathode and an anode, characterized in that, the organic photoelectric conversion element comprises a layer comprising a cured product obtained by curing a thermosetting resin composition between the anode and the active layer, and a transmittance of light with a wavelength of 380 nm to 780 nm is 10% or higher.

In the present description, the transmittance of light means a value obtained by the following method of measurement.

A transmission spectrum of the organic photoelectric conversion element of the present invention is measured. In the measurement, light is irradiated in a direction perpendicular to a face on which layers of the organic photoelectric conversion element are stacked. Using the obtained transmission spectrum, the transmission of light with a wavelength of 380 nm to 780 nm is calculated in conformity with the calculation of transmittance of JIS R 3106.

For an apparatus for measuring the transmission spectrum of the organic photoelectric conversion element, a spectrophotometer operating on ultraviolet, visible, and near-infrared wavelength regions (UV-Vis-Near-Infrared spectrophotometer JASCO-V670 manufactured by JASCO Corporation, for example) is used. When JASCO-V670 is used, its measurable wavelength range is 200 nm to 1,500 nm, and measurement is performed on the wavelength range.

The organic photoelectric conversion element according to the present invention is generally provided on a supporting substrate.

Examples of the organic photoelectric conversion element according to the present invention may include an organic photoelectric conversion element in which the supporting substrate, the cathode, the active layer, the layer comprising a cured product obtained by curing a thermosetting resin composition, and the anode are stacked in this order and an organic photoelectric conversion element in which the supporting substrate, the anode, the layer comprising a cured product obtained by curing a thermosetting resin composition, the active layer, and the cathode are stacked in this order.

The organic photoelectric conversion element according to the present invention may have another layer other than the cathode, the anode, the active layer, and the layer comprising a cured product obtained by curing a thermosetting resin composition.

The organic photoelectric conversion element according to the present invention may further have an electron transport layer, for example, as the other layer.

The electron transport layer is generally provided between the cathode and the active layer.

The following describes the layers in detail.

<Supporting Substrate>

The organic photoelectric conversion element is generally formed on the supporting substrate. For the supporting substrate, substrates that do not chemically change when the organic photoelectric conversion element is made are suitably used. Examples of the supporting substrate may include glass substrates, plastic substrates, polymer films, and silicon plates. The transmittance of light with a wavelength of 380 nm to 780 nm of the supporting substrates is preferably 90% or higher and further preferably 95% or higher.

<Electrodes>

The organic photoelectric conversion element according to the present invention has the cathode and the anode.

In the following explanation, a first electrode is an electrode closer to the supporting substrate, whereas a second electrode is an electrode farther from the supporting substrate. One of the first electrode and the second electrode is used as the anode, whereas the other thereof is used as the cathode. In the organic photoelectric conversion element of the present invention, the first electrode is preferably the cathode.

(First Electrode)

The first electrode is not limited to a particular electrode so long as it is an electrode having a light transmission property usable as an electrode of the organic photoelectric conversion element.

The first electrode can take a single-layer form or a form in which a plurality of layers are stacked.

Examples of the material of the first electrode may include metal oxides such as indium oxide, zinc oxide, and tin oxide; complex oxides such as indium tin oxide (ITO) and indium zinc oxide (IZO) as complexes thereof; metals such as gold, platinum, silver, and copper; and organic conductive materials such as polyaniline and derivatives thereof and polythiophene and derivatives thereof.

The material of the first electrode may be one or two or more.

When these materials are not transparent, they are made into a thin film thin enough to pass light or formed in a grid shape to be able to be an electrode having a light transmittance property.

Examples of the first electrode may include metal oxide thin films, metallic thin films, and organic conductive films.

The thickness of the first electrode may be 1,000 nm or smaller or 500 nm or smaller, for example.

(Second Electrode)

The second electrode is not limited to a particular electrode so long as it is an electrode having a light transmission property usable as an electrode of the organic photoelectric conversion element.

Examples of the material of the second electrode may include the same materials above exemplified as the material of the first electrode.

The material of the second electrode may be one or two or more.

When these materials are not transparent, they are made into a thin film thin enough to pass light or formed in a grid shape to be able to be an electrode having a light transmittance property.

Examples of the second electrode may include metal oxide thin films, metallic thin films, metallic nanowire layers, and organic conductive thin films. In viewpoint of improving a light transmittance property, the second electrode is preferably a metallic nanowire layer.

The thickness of the second electrode may be 10 nm or larger or 50 nm or larger, for example. When the second electrode is a metal oxide thin film or a metallic thin film, the thickness of the second electrode is preferably 20 nm or smaller.

<Active Layer>

Examples of the active layer may include a layer comprising a P-type semiconductor material and an N-type semiconductor material.

[1] P-Type Semiconductor Material

The P-type semiconductor material is preferably a polymer compound; examples of the polymer compound may include a polymer compound having a structural unit represented by Formula (I) or Formula (II).

[Chemical Formula 6]

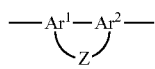

(I)

[Chemical Formula 7]

(Z-1)

(Z-2)

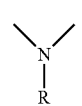

(Z-3)

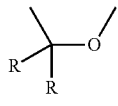

(Z-4)

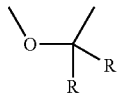

(Z-5)

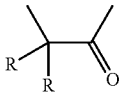

(Z-6)

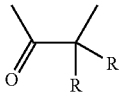

(Z-7)

In Formula (I), $Ar^1$ and $Ar^2$ each independently represent a trivalent aromatic hydrocarbon group or a trivalent aromatic heterocyclic group, Z represents a divalent group represented by Formula (Z-1), (Z-2), (Z-3), (Z-4), (Z-5), (Z-6), or (Z-7).

R represents a hydrogen atom, a halogen atom, an amino group, a cyano group, a monovalent aromatic hydrocarbon group, a monovalent heterocyclic group, an alkyl group optionally having a substituent, a cycloalkyl group optionally having a substituent, an alkoxy group optionally having a substituent, a cycloalkoxy group optionally having a substituent, an alkylthio group optionally having a substituent, a cycloalkylthio group optionally having a substituent, an aryloxy group optionally having a substituent, an arylthio group optionally having a substituent, an arylalkyl group optionally having a substituent, an arylalkoxy group optionally having a substituent, an arylalkylthio group optionally having a substituent, an acyl group optionally having a substituent, an acyloxy group optionally having a substituent, an amide group optionally having a substituent, an acid imide group optionally having a substituent, a substituted amino group, a substituted silyl group, a substituted silyloxy group, a substituted silylthio group, a heterocyclyloxy group, a heterocyclylthio group, an arylalkenyl group, an arylalkynyl group, or a carboxy group.

The two Rs in Formulae (Z-1), (Z-2), (Z-4), (Z-5), (Z-6), and (Z-7) are the same as or different from each other.

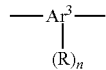

(II)

In Formula (II), $Ar^3$ represents a divalent fused polycyclic aromatic hydrocarbon group or a divalent fused polycyclic aromatic heterocyclic group having a fused ring in which two or more and five or less rings selected from the group consisting of aromatic rings and heteroaromatic rings are fused, n represents an integer of 1 to 6, and R represents the same meaning as the above.

(Structural Unit Represented by Formula (I)) (About R)

The halogen atom represented by R may be a fluorine atom, a chlorine atom, a bromine atom, or an iodine atom; a fluorine atom is preferred.

The alkyl group may be linear or branched. The carbon atom number of the alkyl group is generally 1 to 30 excluding the carbon atom number of a substituent. The alkyl group optionally has a substituent; examples of the substituent that the alkyl group optionally has may include a halogen atom, a cyano group, and a hydroxyl group. Specific examples of the halogen atom are the same as the specific examples of the halogen atom represented by R.

Specific examples of the alkyl group may include a methyl group, an ethyl group, a propyl group, an isopropyl group, a butyl group, an isobutyl group, a sec-butyl group, a tert-butyl group, a pentyl group, an isopentyl group, a 2-methylbutyl group, a 1-methylbutyl group, a hexyl group, an isohexyl group, a 3-methylpentyl group, a 2-methylpentyl group, a 1-methylpentyl group, a heptyl group, an octyl group, an isooctyl group, a 2-ethylhexyl group, a 3,7-dimethyloctyl group, a nonyl group, a decyl group, an undecyl group, a dodecyl group, a tetradecyl group, a hexadecyl group, an octadecyl group, and an eicosyl group.

Specific examples of the alkyl group having a substituent may include a 2-cyanoethyl group, 2-hydroxyethyl group, and a 2-fluoropropyl group.

The carbon atom number of the cycloalkyl group is generally 3 to 30 excluding the carbon atom number of a substituent. The cycloalkyl group may have a substituent; examples of the substituent that the cycloalkyl group optionally has may include a halogen atom. Specific examples of the halogen atom are the same as the specific examples of the halogen atom represented by R.

Specific examples of the cycloalkyl group may include a cyclopentyl group, a cyclohexyl group, and an adamantyl group.

The alkoxy group may be linear or branched. The carbon atom number of the alkoxy group is generally 1 to 20 excluding the carbon atom number of a substituent. The alkoxy group optionally has a substituent; examples of the substituent that the alkoxy group optionally has may include a halogen atom and an alkoxy group. Specific examples of the halogen atom are the same as the specific examples of the halogen atom represented by R.

Specific examples of the alkoxy group may include a methoxy group, an ethoxy group, a propoxy group, an isopropoxy group, a butoxy group, an isobutoxy group, a tert-butoxy group, a pentyloxy group, a hexyloxy group, a cyclohexyloxy group, a heptyloxy group, an octyloxy group, a 2-ethylhexyloxy group, a nonyloxy group, a decyloxy group, a 3,7-dimethyloctyloxy group, and a lauryloxy group.

Specific examples of the alkoxy group having a substituent may include a trifluoromethoxy group, a pentafluoroethoxy group, a perfluorobutoxy group, a perfluorohexyloxy group, a perfluorooctyloxy group, a methoxymethyloxy group, and a 2-methoxyethyloxy group.

The carbon atom number of the cycloalkoxy group is generally 2 to 20 excluding the carbon atom number of a substituent. The cycloalkoxy group optionally has a substituent; examples of the substituent that the cycloalkoxy group optionally has may include a halogen atom and an alkoxy group. Specific examples of the halogen atom are the same as the specific examples of the halogen atom represented by R.

Specific examples of the cycloalkoxy group may include a cyclohexyloxy group.

The alkylthio group may be linear or branched.

The carbon atom number of the alkylthio group is generally 1 to 20 excluding the carbon atom number of a substituent. The alkylthio group optionally has a substituent; examples of the substituent that the alkylthio group optionally has may include a halogen atom. Specific examples of the halogen atom are the same as the specific examples of the halogen atom represented by R.

Specific examples of the alkylthio group may include a methylthio group, an ethylthio group, a propylthio group, an isopropylthio group, a butylthio group, an isobutylthio group, a tert-butylthio group, a pentylthio group, a hexylthio group, a cyclohexylthio group, a heptylthio group, an octylthio group, a 2-ethylhexylthio group, a nonylthio group, a decylthio group, a 3,7-dimethyloctylthio group, and a laurylthio group.

Specific examples of the alkylthio group having a substituent may include a trifluoromethylthio group.

The carbon atom number of the cycloalkylthio group is generally 2 to 20 excluding the carbon atom number of a substituent. The cycloalkylthio group optionally has a substituent; examples of the substituent that the cycloalkylthio group optionally has may include a halogen atom. Specific examples of the halogen atom are the same as the specific examples of the halogen atom represented by R.

Specific examples of the cycloalkylthio group may include a cyclohexylthio group.

The monovalent aromatic hydrocarbon group optionally having a substituent is an atomic group obtained by eliminating one hydrogen atom directly bonded to a carbon atom forming an aromatic ring from an aromatic hydrocarbon group optionally having a substituent.

The carbon atom number of the monovalent aromatic hydrocarbon group is generally 6 to 60 excluding the carbon atom number of a substituent. The aromatic hydrocarbon group optionally has a substituent; examples of the substituent that the aromatic hydrocarbon group optionally has may include a halogen atom, an alkyl group, a cycloalkyl group, an alkoxy group, a cycloalkoxy group, an alkylthio group, and a cycloalkylthio group. Specific examples of the halogen atom, the alkyl group, the cycloalkyl group, the alkoxy group, the cycloalkoxy group, the alkylthio group, and the cycloalkylthio group are the same as the specific examples of the halogen atom, the alkyl group, the cycloalkyl group, the alkoxy group, the cycloalkoxy group, the alkylthio group, and the cycloalkylthio group represented by R.

Specific examples of the monovalent aromatic hydrocarbon group may include a phenyl group, a $C_1$-$C_{12}$ alkyloxyphenyl group, a $C_1$-$C_{12}$ alkylphenyl group, a 1-naphthyl group, a 2-naphthyl group, and a pentafluorophenyl group.

In the present description, the $C_1$-$C_{12}$ alkyl represents alkyl having 1 to 12 carbon atoms. The $C_1$-$C_{12}$ alkyl is preferably $C_1$-$C_8$ alkyl and more preferably $C_1$-$C_6$ alkyl (the $C_1$-$C_8$ alkyl represents alkyl having 1 to 8 carbon atoms, whereas the $C_1$-$C_6$ alkyl represents alkyl having 1 to 6 carbon atoms). Specific examples of the $C_1$-$C_{12}$ alkyl, the $C_1$-$C_8$ alkyl, and the $C_1$-$C_6$ alkyl may include those described and exemplified above as the alkyl group.

The aryloxy group is a group consisting of a monovalent aromatic hydrocarbon group and an oxygen atom; examples of a substituent that the monovalent aromatic hydrocarbon group and the monovalent aromatic hydrocarbon group optionally has may include those exemplified above. The carbon atom number of aryloxy group is generally 6 to 60 excluding the carbon atom number of the substituent.

Specific examples of the aryloxy group may include a phenoxy group, a $C_1$-$C_{12}$ alkyloxyphenoxy group, a $C_1$-$C_{12}$ alkylphenoxy group, a 1-naphthyloxy group, a 2-naphthyloxy group, and a pentafluorophenyloxy group.

The arylthio group is a group consisting of a monovalent aromatic hydrocarbon group and a sulfur atom; examples of the aryl group (the monovalent aromatic hydrocarbon group and a substituent that the monovalent aromatic hydrocarbon group optionally has) may include those exemplified above. The carbon atom number of the arylthio group is generally 6 to 60 excluding the carbon atom number of the substituent.

Specific examples of the arylthio group may include a phenylthio group, a $C_1$-$C_{12}$ alkyloxyphenylthio group, a $C_1$-$C_{12}$ alkylphenylthio group, a 1-naphthylthio group, a 2-naphthylthio group, and a pentafluorophenylthio group.

The arylalkyl group is an alkyl group having a monovalent aromatic hydrocarbon group as a substituent; the alkyl group, the monovalent aromatic hydrocarbon group, and a substituent that the monovalent aromatic hydrocarbon group optionally has may be the individual examples exemplified above. The carbon atom number of the arylalkyl group is generally 7 to 60 excluding the carbon atom number of the substituent. The arylalkyl group optionally has a substituent on the alkyl moiety; examples of the substituent that the arylalkyl group optionally has may include a halogen atom, a cyano group, and a hydroxyl group. Specific examples of the halogen atom are the same as the specific examples of the halogen atom represented by R.

Specific examples of the arylalkyl group may include a phenyl-$C_1$-$C_{12}$ alkyl group, a $C_1$-$C_{12}$ alkyloxyphenyl-$C_1$-$C_{12}$ alkyl group, a $C_1$-$C_{12}$ alkylphenyl-$C_1$-$C_{12}$ alkyl group, a 1-naphthyl-$C_1$-$C_{12}$ alkyl group, and a 2-naphthyl-$C_1$-$C_{12}$ alkyl group, a pentafluorophenyl-$C_1$-$C_{12}$ alkyl group.

The arylalkoxy group is an alkoxy group having a monovalent aromatic hydrocarbon group as a substituent; the alkoxy group, the monovalent aromatic hydrocarbon group, and a substituent that the monovalent aromatic hydrocarbon group optionally has may be the individual examples exemplified above. The carbon atom number of the arylalkoxy group is generally 7 to 60 excluding the carbon number of the substituent. The arylalkoxy group optionally has a substituent on the alkoxy moiety; examples of the substituent that the arylalkoxy group optionally has may include a halogen atom. Specific examples of the halogen atom are the same as the specific examples of the halogen atom represented by R.

Specific examples of the arylalkoxy group may include a phenyl-$C_1$-$C_{12}$ alkyloxy group, a $C_1$-$C_{12}$ alkyloxyphenyl-$C_1$-$C_{12}$ alkyloxy group, a $C_1$-$C_{12}$ alkylphenyl-$C_1$-$C_{12}$ alkyloxy group, a 1-naphthyl-$C_1$-$C_{12}$ alkyloxy group, and a 2-naphthyl-$C_1$-$C_{12}$ alkyloxy group.

The arylalkylthio group is an alkylthio group having a monovalent aromatic hydrocarbon group as a substituent; the alkylthio group, the monovalent aromatic hydrocarbon group, and a substituent that the monovalent aromatic hydrocarbon group optionally has may be the individual examples exemplified above. The carbon atom number of the arylalkylthio group is generally 7 to 60 excluding the carbon atom number of the substituent. The arylalkylthio group optionally has a substituent on the alkylthio moiety; examples of the substituent that the arylalkylthio group optionally has may include a halogen atom. Specific examples of the halogen atom are the same as the specific examples of the halogen atom represented by R.

Specific examples of the arylalkylthio group may include a phenyl-$C_1$-$C_{12}$ alkylthio group, a $C_1$-$C_{12}$ alkyloxyphenyl-$C_1$-$C_{12}$ alkylthio group, a $C_1$-$C_{12}$ alkylphenyl-$C_1$-$C_{12}$ alkylthio group, a 1-naphthyl-$C_1$-$C_{12}$ alkylthio group, and a 2-naphthyl-$C_1$-$C_{12}$ alkylthio group.

The carbon atom number of the acyl group is generally 2 to 20 excluding the carbon atom number of a substituent. The acyl group optionally has a substituent; examples of the substituent that the acyl group optionally has may include a halogen atom. Specific examples of the halogen atom are the same as the specific examples of the halogen atom represented by R.

Specific examples of the acyl group may include an acetyl group, a propionyl group, a butyryl group, an isobutyryl group, a pivaloyl group, and a benzoyl group.

Specific examples of the acyl group having a substituent may include a trifluoroacetyl group and a pentafluorobenzoyl group.

The carbon atom number of the acyloxy group is generally 2 to 20 excluding the carbon atom number of a substituent. The acyloxy group optionally has a substituent; examples of the substituent that the acyloxy group optionally has may include a halogen atom. Specific examples of the halogen atom are the same as the specific examples of the halogen atom represented by R.

Specific examples of the acyloxy group may include an acetoxy group, a propionyloxy group, a butyryloxy group, an isobutyryloxy group, a pivaloyloxy group, and a benzoyloxy group.

Specific examples of the acyloxy group having a substituent may include a trifluoroacetyloxy group and a pentafluorobenzoyloxy group.

The amide group represents a group obtained by eliminating one hydrogen atom bonded to the nitrogen atom from amide. The carbon atom number of the amide group is generally 1 to 20 excluding the carbon atom number of a substituent. The amide group optionally has a substituent; examples of the substituent that the amide group optionally has may include a halogen atom. Specific examples of the halogen atom are the same as the specific examples of the halogen atom represented by R.

Specific examples of the amide group may include a formamide group, an acetoamide group, a propionamide group, a butyramide group, a benzamide group, a diformamide group, a diacetamide group, a dipropionamide group, a dibutyramide group, and a dibenzamide group.

Specific examples of the amide group having a substituent may include trifluoroacetamide group, a pentafluorobenzamide group, a ditrifluoroacetamide group, and a dipentafluorobenzamide group.

The acid imide group represents a group obtained by eliminating one hydrogen atom bonded to the nitrogen atom from acid imide. The carbon atom number of the acid imide group is generally 2 to 20 excluding the carbon atom number of substituent. The acid imide group optionally has a substituent; examples of the substituent that the acid imide group optionally has may include a halogen atom. Specific examples of the halogen atom are the same as the specific examples of the halogen atom represented by R.

Specific examples of the acid imide group may include a succinimide group and a phthalic acid imide group.

The substituted amino group represents a group in which one or two hydrogen atoms of an amino group ($-NH_2$) are substituted with a substituent. Examples of the substituent may include an alkyl group optionally having a substituent, a cycloalkyl group optionally having a substituent, and a monovalent aromatic hydrocarbon group optionally having a substituent. Specific examples of the alkyl group optionally having a substituent, the cycloalkyl group optionally having a substituent, and the monovalent aromatic hydrocarbon group optionally having a substituent are the same as the specific examples of the alkyl group optionally having a substituent, the cycloalkyl group optionally having a substituent, and the monovalent aromatic hydrocarbon group optionally having a substituent represented by R.

The carbon atom number of the substituted amino group is generally 1 to 40.

Specific examples of the substituted amino group may include a methylamino group, a dimethylamino group, an ethylamino group, a diethylamino group, a propylamino group, a dipropylamino group, an isopropylamino group, a diisopropylamino group, a butylamino group, an isobutylamino group, a tert-butylamino group, a pentylamino group, a hexylamino group, a cyclohexylamino group, a heptylamino group, an octylamino group, a 2-ethylhexylamino group, a nonylamino group, a decylamino group, a 3,7-dimethyloctylamino group, a laurylamino group, a cyclopentylamino group, a dicyclopentylamino group, a cyclohexylamino group, a dicyclohexylamino group, a pyrrolidyl group, a piperidyl group, a ditrifluoromethylamino group, a phenylamino group, a diphenylamino group, a $C_1$-$C_{12}$ alkyloxyphenylamino group, a di($C_1$-$C_{12}$ alkyloxyphenyl)amino group, a di (($C_1$-$C_{12}$ alkylphenyl)amino group, a 1-naphthylamino group, a 2-naphthylamino group, a pentafluorophenylamino group, a pyridylamino group, a pyridazinylamino group, a pyrimidylamino group, a pyrazylamino group, a triazylamino group, a phenyl-$C_1$-$C_{12}$ alkylamino group, a $C_1$-$C_{12}$ alkyloxyphenyl-$C_1$-$C_{12}$ alkylamino group, a $C_1$-$C_{12}$ alkylphenyl-$C_1$-$C_{12}$ alkylamino group, a di ($C_1$-$C_{12}$ alkyloxyphenyl-$C_1$-$C_{12}$ alkyl)amino group, a di($C_1$-$C_{12}$ alkylphenyl-$C_1$-$C_{12}$ alkyl)amino group, a 1-naphthyl-$C_1$-$C_{12}$ alkylamino group, and a 2-naphthyl-$C_1$-$C_{12}$ alkylamino group.

The substituted silyl group represents a group in which three hydrogen atoms of a silyl group ($-SiH_3$) are substituted with a substituent. Examples of the substituent may include an alkyl group optionally having a substituent, a cycloalkyl group optionally having a substituent, and a monovalent aromatic hydrocarbon group optionally having a substituent. Specific examples of the alkyl group optionally having a substituent, the cycloalkyl group optionally having a substituent, and the monovalent aromatic hydrocarbon group optionally having a substituent are the same as the specific examples of the alkyl group optionally having a substituent, the cycloalkyl group optionally having a substituent, and the monovalent aromatic hydrocarbon group optionally having a substituent represented by R, respectively.

The carbon atom number of the substituted silyl group is generally 3 to 40.

Specific examples of the substituted silyl group may include a trimethylsilyl group, a triethylsilyl group, a tripropylsilyl group, a triisopropylsilyl group, a tert-butyldimethylsilyl group, a triphenylsilyl group, a tri-p-xylylsilyl group, a tribenzylsilyl group, a diphenylmethylsilyl group, a tert-butyldiphenylsilyl group, and a dimethylphenylsilyl group.

The substituted silyloxy group is a group consisting of a substituted silyl group and an oxygen atom; examples of the substituted silyl group may include those exemplified above.

The carbon atom number of the substituted silyloxy group may be 3 to 40.

Specific examples of the substituted silyloxy group may include a trimethylsilyloxy group, a triethylsilyloxy group, a tripropylsilyloxy group, a triisopropylsilyloxy group, a tert-butyldimethylsilyloxy group, a triphenylsilyloxy group, a tri-p-xylylsilyloxy group, a tribenzylsilyloxy group, a diphenylmethylsilyloxy group, a tert-butyldiphenylsilyloxy group, and a dimethylphenylsilyloxy group.

The substituted silylthio group is a group consisting of a substituted silyl group and a sulfur atom; examples of the substituted silyl group may include those exemplified above.

The carbon atom number of the substituted silylthio group is generally 3 to 40.

Specific examples of the substituted silylthio group may include a trimethylsilylthio group, a triethylsilylthio group, a tripropylsilylthio group, a triisopropylsilylthio group, a tert-butyldimethylsilylthio group, a triphenylsilylthio group, a tri-p-xylylsilylthio group, a tribenzylsilylthio group, a diphenylmethylsilylthio group, a tert-butyldiphenylsilylthio group, and a dimethylphenylsilylthio group.

The monovalent heterocyclic group is an atomic group obtained by eliminating one hydrogen atom directly bonded to an atom forming a heterocycle from a heterocyclic compound optionally having a substituent.

The carbon atom number of the heterocyclic compound is generally 3 to 20 excluding the carbon atom number of the substituent. Examples of the heterocyclic compound may include furan, thiophene, pyrrole, pyrroline, pyrrolidine, oxazole, isoxazole, triazole, isothiazole, imidazole, imidazoline, imidazolidine, pyrazole, pyrazoline, pyrazolidine, furazan, triazole, thiadiazole, oxadiazole, tetrazole, pyran, pyridine, piperidine, thiopyran, pyridazine, pyrimidine, pyrazine, piperazine, morpholine, triazine, benzofuran, isobenzofuran, benzothiophene, indole, isoindole, indolizine, indoline, isoindoline, chromene, chroman, isochroman, benzopyran, quinoline, isoquinoline, quinolizine, benzimidazole, benzothiazole, indazole, naphthyridine, quinoxaline, quinazoline, quinazolidine, cinnoline, phthalazine, purine, pteridine, carbazole, xanthene, phenanthridine, acridine, β-carboline, perimidine, phenanthroline, thianthrene, phenoxathiin, phenoxazine, phenothiazine, and phenazine.

Examples of the substituent that the heterocyclic compound optionally has may include a halogen atom, an alkyl group, a cycloalkyl group, an alkoxy group, a cycloalkoxy group, an alkylthio group, and a cycloalkylthio group. Specific examples of the halogen atom, the alkyl group, the cycloalkyl group, the alkoxy group, the cycloalkoxy group, the alkylthio group, and the cycloalkylthio group are the same as the specific examples of the halogen atom, the alkyl group, the cycloalkyl group, the alkoxy group, the cycloalkoxy group, the alkylthio group, and the cycloalkylthio group represented by R.

The carbon atom number of the monovalent heterocyclic group is generally 3 to 20 excluding the carbon atom number of the substituent. The monovalent heterocyclic group is preferably a monovalent aromatic heterocyclic group.

The heterocyclyloxy group is a group consisting of a monovalent heterocyclic group and an oxygen atom; the monovalent heterocyclic group and a substituent that the monovalent heterocyclic group optionally has may be the examples exemplified above.

The carbon atom number of the heterocyclicoxy group is generally 3 to 20 excluding the carbon atom number of the substituent.

Specific examples of the heterocyclyloxy group may include a thienyloxy group, a $C_1$-$C_{12}$ alkylthienyloxy group, a pyrrolyloxy group, furyloxy group, a pyridyloxy group, a $C_1$-$C_{12}$ alkylpyridyloxy group, an imidazolyloxy group, a pyrazolyloxy group, a triazolyloxy group, an oxazolyloxy group, a thiazoloxy group, and a thiadiazoloxy group.

The heterocyclylthio group is a group consisting of a monovalent heterocyclic group and a sulfur atom; the monovalent heterocyclic group and a substituent that the monovalent heterocyclic group optionally has may be the examples exemplified above.

The carbon atom number of the heterocyclylthio group is generally 3 to 20 excluding the carbon atom number of the substituent.

Specific examples of the heterocyclylthio group may include a thienylmercapto group, a $C_1$-$C_{12}$ alkylthienylmercapto group, a pyrrolylmercapto group, a furylmercapto group, a pyridylmercapto group, a $C_1$-$C_{12}$ alkylpyridylmercapto group, an imidazolylmercapto group, a pyrazolylmercapto group, a triazolylmercapto group, an oxazolylmercapto group, a thiazolemercapto group, and a thiadiazolemercapto group.

The arylalkenyl group is an alkenyl group having a monovalent aromatic hydrocarbon group as a substituent; the monovalent aromatic hydrocarbon group and a substituent that the monovalent aromatic hydrocarbon group optionally has may be the examples exemplified above. The alkenyl group represents a monovalent group obtained by eliminating one hydrogen atom from any carbon atom of alkene.

The carbon atom number of the arylalkenyl group is generally 8 to 20 excluding the carbon atom number of the substituent. Specific examples of the arylalkenyl group may include a styryl group.

The arylalkynyl group is an alkynyl group having a monovalent aromatic hydrocarbon group as a substituent; the monovalent aromatic hydrocarbon group and a substituent that the monovalent aromatic hydrocarbon group optionally has may be the examples exemplified above. The alkynyl group represents a monovalent group obtained by eliminating one hydrogen atom from any carbon atom of alkyne.

The carbon atom number of the arylalkynyl group is generally 8 to 20 excluding the carbon atom number of the substituent. Specific examples of the arylalkynyl group may include a phenylacetylenyl group.

In viewpoint of increasing the solubility of the compound having the structural unit represented by Formula (I) to a solvent, R is preferably an alkyl group having 6 to 30 carbon atoms, a cycloalkyl group having 6 to 30 carbon atoms, an alkoxy group having 6 to 20 carbon atoms, a cycloalkoxy group having 6 to 20 carbon atoms, an alkylthio group having 6 to 20 carbon atoms, a cycloalkylthio group having 6 to 20 carbon atoms, a monovalent aromatic hydrocarbon group, an aryloxy group, an arylthio group, an arylalkyl group, an arylalkyloxy group, an arylalkylthio group, an acyl group having 6 to 20 carbon atoms, or an acyloxy group having 6 to 20 carbon atoms, more preferably an alkyl group having 6 to 30 carbon atoms, a cycloalkyl group having 6 to 30 carbon atoms, an alkoxy group having 6 to 20 carbon atoms, a cycloalkoxy group having 6 to 20 carbon atoms, a monovalent aromatic hydrocarbon group, or an aryloxy group, and still more preferably an alkyl group having 6 to 30 carbon atoms.

Examples of the alkyl group having 6 to 30 carbon atoms as one preferred embodiment of R may include linear alkyl groups such as a hexyl group, a heptyl group, an octyl group, a nonyl group, a decyl group, an undecyl group, a dodecyl group, a tridecyl group, a tetradecyl group, a pentadecyl group, a hexadecyl group, a heptadecyl group, an octadecyl group, a nonadecyl group, an icocyl group, a triacontyl group, a tetracontyl group, and a pentacontyl group; and branched alkyl groups such as a 1,1,3,3-tetramethylbutyl group, a 1-methylheptyl group, a 2-ethylhexyl group, a 3,7-dimethyloctyl group, a 1-propylpentyl group, a 3-heptyldodecyl group, a 2-hepthylundecyl group, a 2-octyldodecyl group, a 3,7,11-trimethyldodecyl group, a 3,7,11,15-tetramethylhexadecyl group, and a 3,5,5-trimethylhexyl group.

The alkyl group having 6 to 30 carbon atoms can be selected as appropriate considering solubility to the solvent and the like. From this viewpoint, the alkyl group having 6 to 30 carbon atoms is preferably a hexyl group, a heptyl group, an octyl group, a nonyl group, a decyl group, an undecyl group, a dodecyl group, a tridecyl group, a tetradecyl group, a pentadecyl group, a hexadecyl group, a 2-ethylhexyl group, a 3,7-dimethyloctyl group, a 1-propylpentyl group, or a 3-heptyldodecyl group, more preferably a hexyl group, a heptyl group, an octyl group, a dodecyl group, a tetradecyl group, a hexadecyl group, a 2-ethylhexyl group, a 3,7-dimethyloctyl group, or a 3-heptyldodecyl group, and still more preferably a hexyl group, an octyl group, a dodecyl group, a hexadecyl group, a 2-ethylhexyl group, a 3,7-dimethyloctyl group, or a 3-heptyldodecyl group.

The aryl group as one preferred embodiment of R is preferably a phenyl group having an alkyl group as a substituent in viewpoint of favorable solubility to the solvent. The position having the alkyl group as the substituent is preferably the para-position.

The phenyl group substituted with an alkyl group at the para-position is preferably a p-hexylphenyl group, a p-heptylphenyl group, a p-octylphenyl group, a p-nonylphenyl group, a p-decylphenyl group, a p-undecylphenyl group, a p-dodecylphenyl group, a p-tridecylphenyl group, a p-tetradecylphenyl group, a p-pentadecylphenyl group, a p-hexadecylphenyl group, a p-2-ethylhexylphenyl group, a p-3,7-dimethyloctylphenyl group, a p-1-propylpentylphenyl group, or a p-2-hexyldecylphenyl group, more preferably a p-hexylphenyl group, a p-heptylphenyl group, a p-octylphenyl group, a p-dodecylphenyl group, a p-pentadecylphenyl group, a p-hexadecylphenyl group, a p-2-ethylhexlphenyl group, a p-3,7-dimethyloctylphenyl group, or a p-2-hexyldecylphenyl group, and still more preferably a p-dodecylphenyl group, a p-pentadecylphenyl group, a p-2-ethylhexylphenyl group, or a p-3,7-dimethyloctylphenyl group.

(About $Ar^1$ and $Ar^2$)

$Ar^1$ and $Ar^2$ each independently represent a trivalent aromatic hydrocarbon group or a trivalent aromatic heterocyclic group.

In viewpoint of further improving photoelectric conversion efficiency, preferably at least one of $Ar^1$ and $Ar^2$ is a trivalent aromatic heterocyclic group; more preferably both of them are trivalent aromatic heterocyclic groups.

The trivalent aromatic hydrocarbon group represented by $Ar^1$ or $Ar^2$ is an atomic group obtained by eliminating three hydrogen atoms on an aromatic ring from an aromatic hydrocarbon optionally having a substituent and includes a group having a benzene ring, a group having a fused ring, and a group in which two or more rings selected from a benzene ring and a fused ring are directly bonded to each other. The carbon atom number of the trivalent aromatic hydrocarbon is generally 6 to 60 and preferably 6 to 20 excluding the carbon atom number of the substituent.

The aromatic hydrocarbon comprised in the trivalent aromatic hydrocarbon group may have a single ring or a fused ring as the aromatic ring. The aromatic ring of the aromatic hydrocarbon is preferably a fused ring in which five or less rings are fused or a single ring, more preferably a fused ring in which two rings are fused or a single ring, and still more preferably a single ring, because the compound further improves in solubility and is easily produced.

Examples of the substituent that the aromatic hydrocarbon comprised in the trivalent aromatic hydrocarbon group optionally has may include a halogen atom, an alkyl group, a cycloalkyl group, an alkyloxy group, an alkylthio group, a cycloalkylthio group, a monovalent aromatic hydrocarbon group, an aryloxy group, an arylthio group, an arylalkyl group, an arylalkyloxy group, an arylalkylthio group, an acyl group, an acyloxy group, an amide group, an imide group, an imino group, an amino group, a substituted amino group, a substituted silyl group, a substituted silyloxy group, a substituted silylthio group, a substituted silylamino group, a monovalent heterocyclic group, an arylalkenyl group, an arylalkynyl group, a carboxyl group, and a cyano group.

Specific examples of the halogen atom, the alkyl group, the cycloalkyl group, the alkyloxy group, the alkylthio group, the cycloalkylthio group, the monovalent aromatic hydrocarbon group, the aryloxy group, the arylthio group, the arylalkyl group, the arylalkyloxy group, the arylalkylthio group, the acyl group, the acyloxy group, the amide group, the imide group, the imino group, the amino group, the substituted amino group, the substituted silyl group, the substituted silyloxy group, the substituted silylthio group, the monovalent heterocyclic group, the arylalkenyl group, the arylalkynyl group, the carboxyl group, and the cyano group may include the groups exemplified above.

The substituted silylamino group is a group in which one or two hydrogen atoms of an amino group ($-NH_2$) are substituted with a substituted silyl group; the substituted silyl group may be those exemplified above. The substituted silylamino group optionally has a substituent other than the substituted silyl group on the amino group moiety; examples of the substituent may include an alkyl group optionally having a substituent, a cycloalkyl group optionally having a substituent, and a monovalent aromatic hydrocarbon group optionally having a substituent. Specific examples of the alkyl group optionally having a substituent, the cycloalkyl group optionally having a substituent, and the monovalent aromatic hydrocarbon group optionally having a substituent are the same as the specific examples of the alkyl group optionally having a substituent and the aryl group represented by R.

The carbon atom number of the substituted silylamino group is generally 3 to 80.

Specific examples of the substituted silylamino group may include a trimethylsilylamino group, a triethylsilylamino group, a tripropylsilylamino group, a triisopropylsilylamino group, a tert-butyldimethylsilylamino group, a triphenylsilylamino group, a tri-p-xylylsilylamino group, a tribenzylsilylamino group, a diphenylmethylsilylamino group, a tert-butyldiphenylsilylamino group, a dimethylphenylsilylamino group, a di(trimethylsilyl)amino group, a di(triethylsilyl)amino group, a di(tripropylsilyl)amino group, a di(triisopropylsilyl)amino group, a di(tert-butyldimethylsilyl)amino group, a di(triphenylsilyl)amino group, a di(tri-p-xylylsilyl)amino group, a di(tribenzylsilyl)amino group, a di(diphenylmethylsilyl)amino group, a di(tert-butyldiphenylsilyl)amino group, and a di(dimethylphenylsilyl)amino group.

Examples of the trivalent aromatic hydrocarbon group represented by $Ar^1$ or $Ar^2$ may include the following groups, and these groups optionally have a substituent.

[Chemical Formula 8]

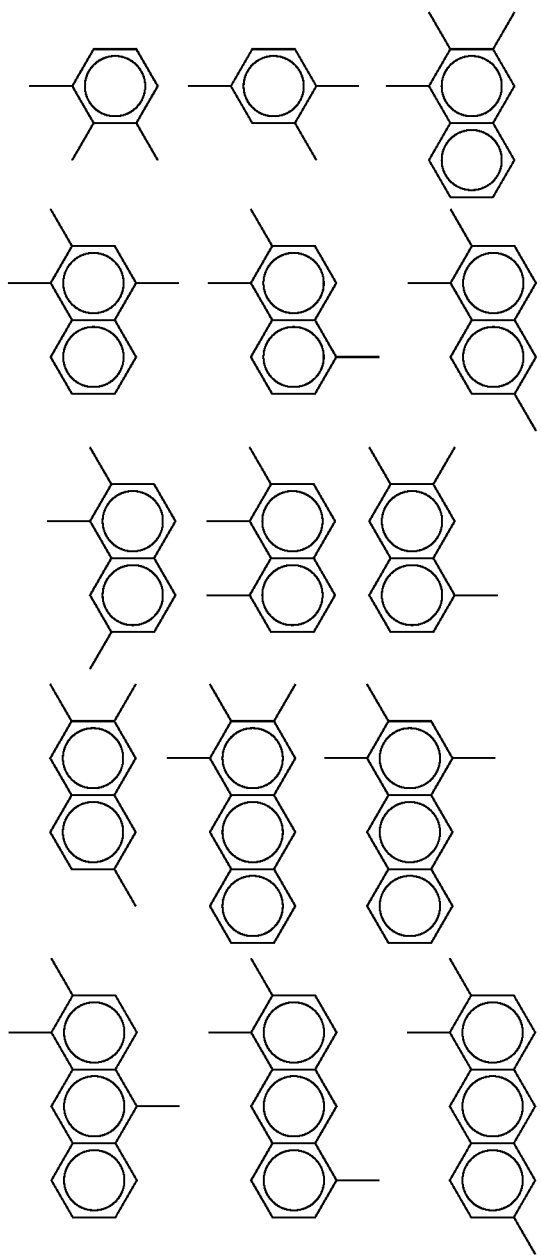
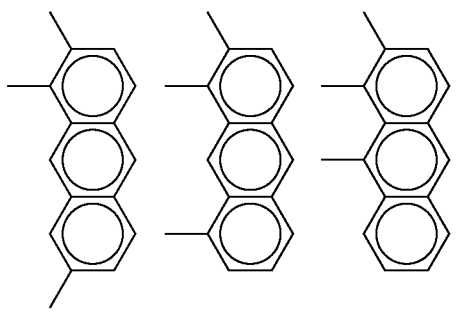
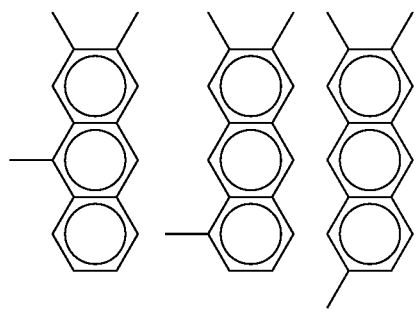

[Chemical Formula 9]

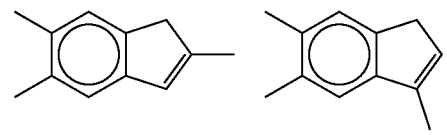
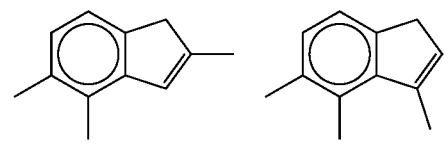
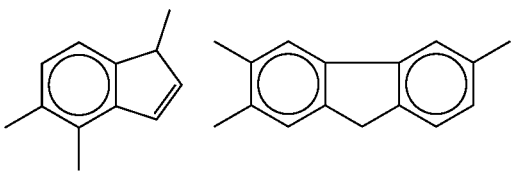
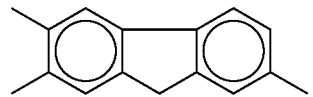
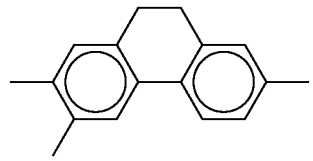
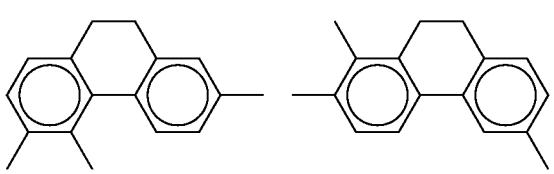

-continued

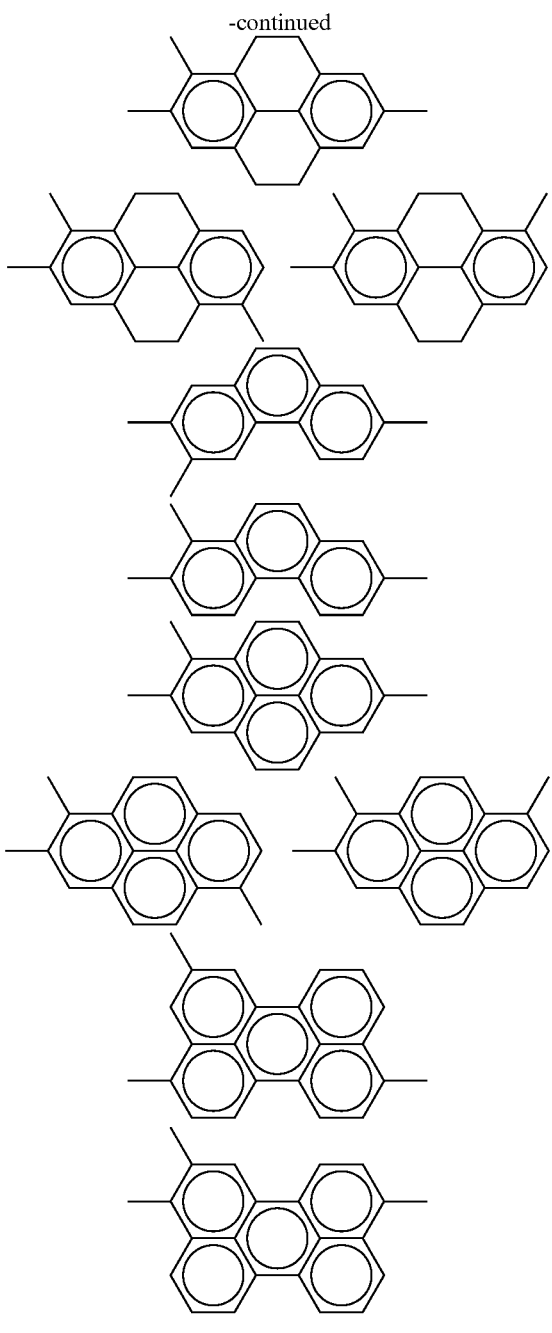

The trivalent aromatic heterocyclic group represented by Ar¹ or Ar² is an atomic group eliminating three hydrogen atoms on a heteroaromatic ring from a heteroaromatic compound optionally having a substituent and may include a group having a single-ring heteroaromatic ring, a group having a fused ring, and a group in which two or more rings selected from independent heteroaromatic rings and fused rings are directly bonded to each other.

Herein, the heteroaromatic compound refers to compounds each having an atom other than a carbon atom (hetero atoms such as an oxygen atom, a sulfur atom, a nitrogen atom, a phosphorous atom, and a boron atom) as elements forming aromatic rings among aromatic compounds.

The carbon atom number of the heteroaromatic compound comprised in the trivalent aromatic heterocyclic group is generally 3 to 60 and preferably 4 to 20 excluding the carbon atom number of the substituent. The heteroaromatic compound may have a single ring or a fused ring as the heteroaromatic ring. The heteroaromatic ring of the heteroaromatic compound is preferably a fused ring in which five or less rings are fused or a single ring, more preferably a fused ring in which two rings are fused or a single ring, and still more preferably a single ring, because the compound further improves in solubility and is easily made. Examples of the substituent that the heteroaromatic compound optionally has are the same as the examples of the substituent that the aromatic hydrocarbon comprised in the trivalent aromatic hydrocarbon group represented by Ar¹ or Ar² optionally has.

Examples of the trivalent aromatic heterocyclic group represented by Ar¹ or Ar² may include the following groups, in which these groups optionally have a substituent.

[Chemical Formula 10]

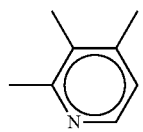
(201)

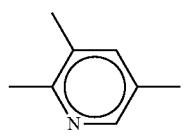
(202)

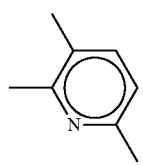
(203)

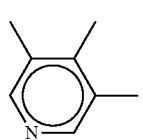
(204)

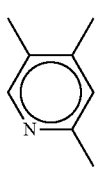
(205)

[Chemical Formula 11]

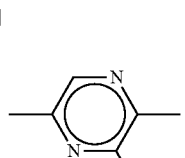
(206)

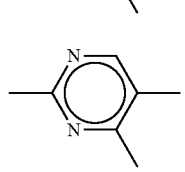
(207)

(208)
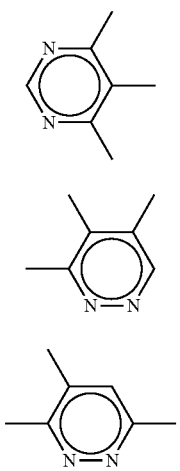
(209)
(210)
[Chemical Formula 12]
(211)
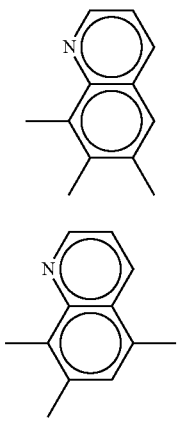
(212)
(213)
(214)
(215)
(216)
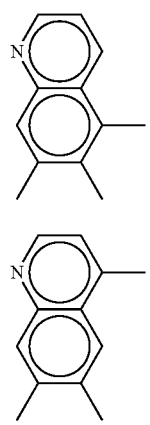
(217)
(218)
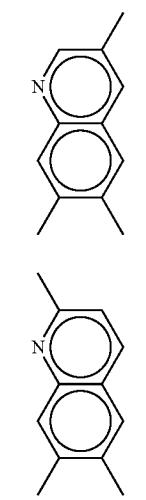
(219)
[Chemical Formula 13]
(220)
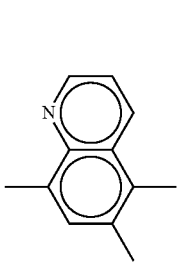
(221)
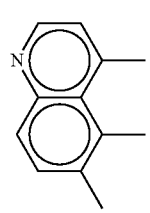
(222)
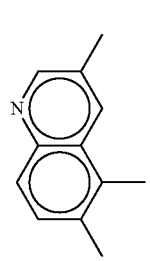

(223) 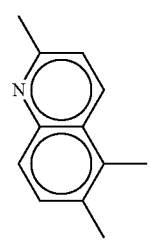
(224) 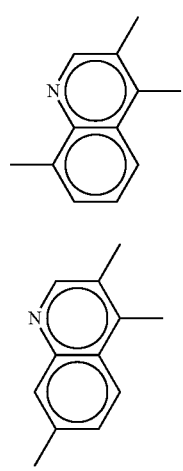
(225)
(226)
(227)
(228)
(229) 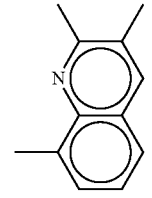
(230) 
(231) 
(232) 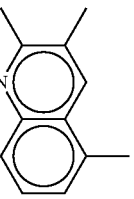
[Chemical Formula 14]
(233) 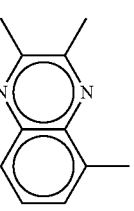
(234) 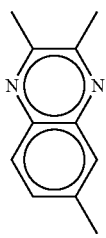
(235) 
(236) 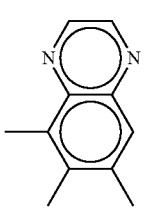

(237) 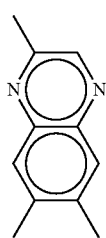
[Chemical Formula 15]
(238) 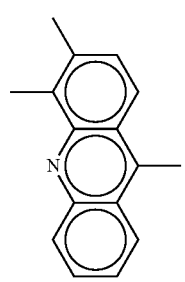
(239) 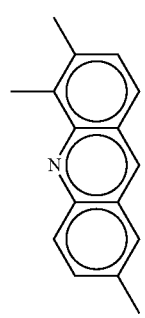
(240) 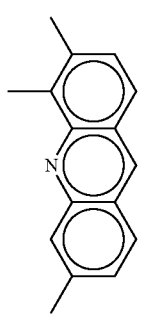
(241) 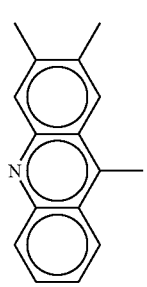
(242) 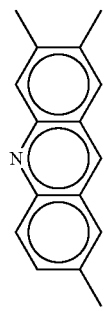
(243) 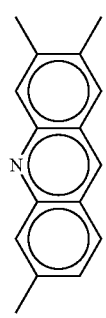
[Chemical Formula 16]
(244) 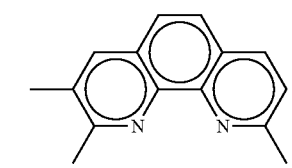
(245) 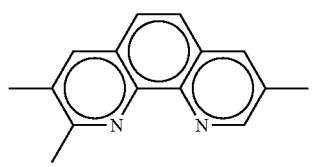
(246) 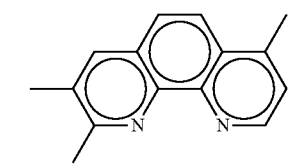
(247) 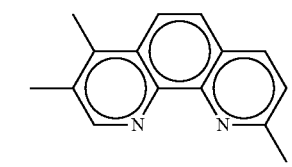
(248) 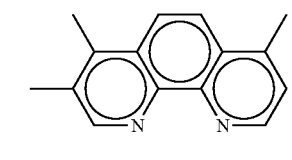
(249) 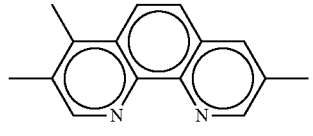

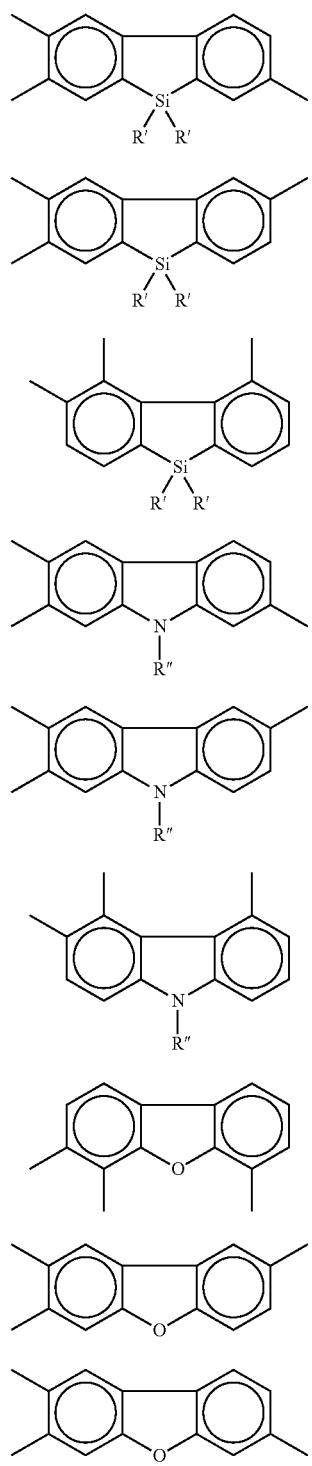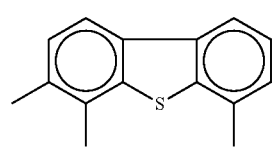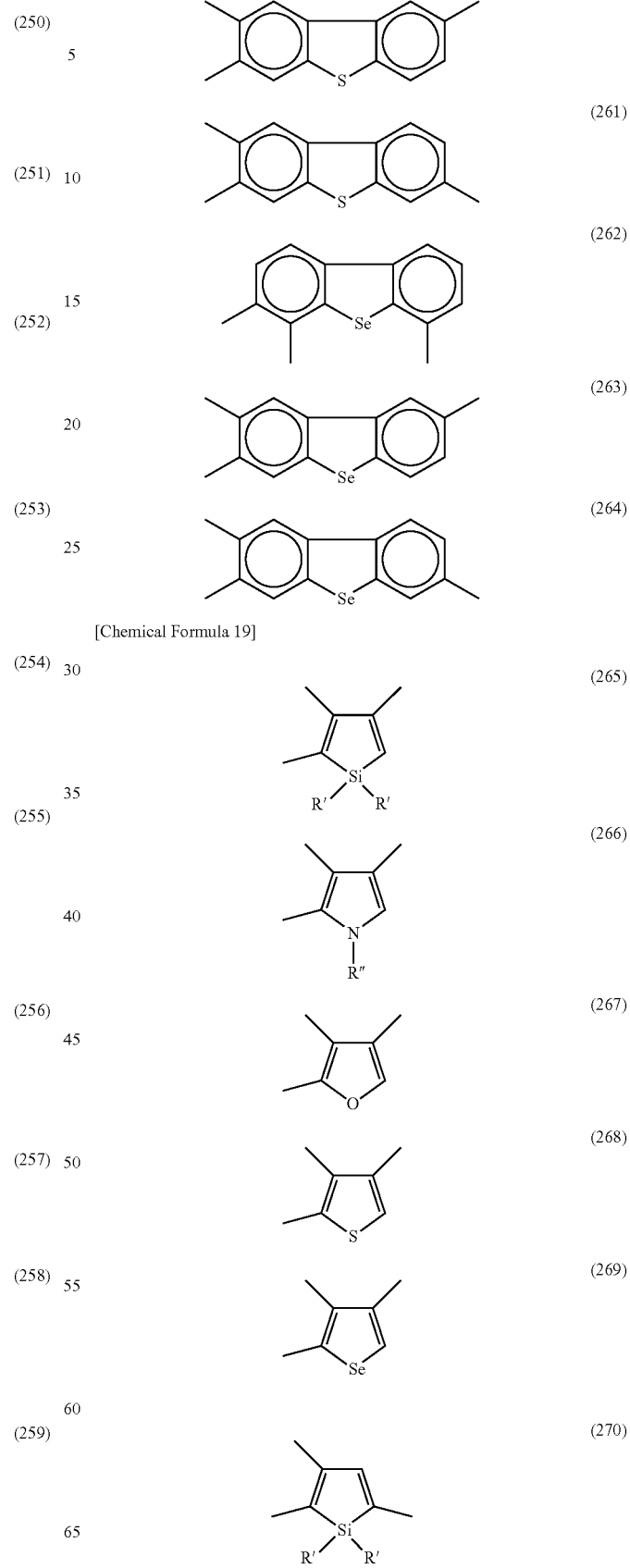

(271) 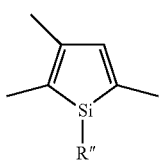

(272) 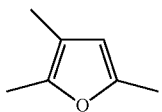

(273) 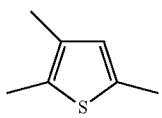

(274) 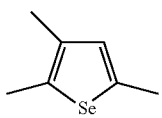

[Chemical Formula 20]

(275) 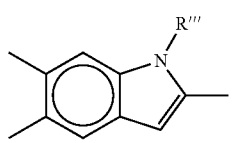

(276) 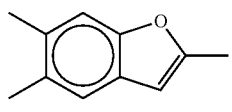

(277) 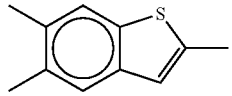

(278) 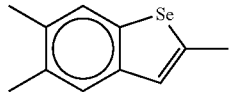

(279) 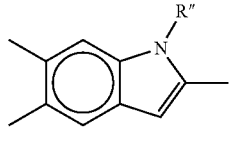

(280) 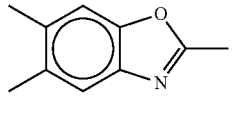

(281) 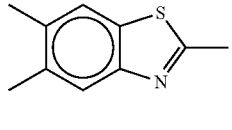

(282) 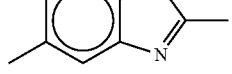

(283) 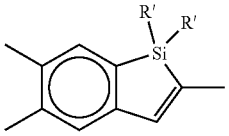

(284) 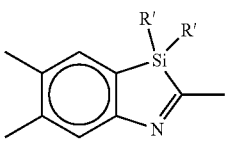

In the formulae, a plurality of R's are the same as or different from each other and each represent a hydrogen atom, a halogen atom, an alkyl group, a cycloalkyl group, an alkoxy group, a cycloalkoxy group, an alkylthio group, a cycloalkylthio group, a monovalent aromatic hydrocarbon group, an aryloxy group, an arylthio group, an arylalkyl group, an arylalkoxy group, an arylalkylthio group, a substituted amino group, an acyloxy group, an amide group, an arylalkenyl group, an arylalkynyl group, a monovalent heterocyclic group, or a cyano group; and A plurality of R"s are the same as or different from each other and each represent a hydrogen atom, an alkyl group, a cycloalkyl group, a monovalent aromatic hydrocarbon group, an arylalkyl group, a substituted silyl group, an acyl group, or a monovalent heterocyclic group.

The definitions and specific examples of the alkyl group, the cycloalkyl group, an alkoxy group, the cycloalkoxy group, the alkylthio group, the cycloalkylthio group, the monovalent aromatic hydrocarbon group, the aryloxy group, the arylthio group, the arylalkyl group, the arylalkoxy group, the arylalkylthio group, the substituted amino group, the acyloxy group, the amide group, the arylalkenyl group, the arylalkynyl group, and the monovalent heterocyclic group represented by R' are the same as the definitions and specific examples of the alkyl group, the cycloalkyl group, the alkoxy group, the cycloalkoxy group, the alkylthio group, the cycloalkylthio group, the monovalent aromatic hydrocarbon group, the aryloxy group, the arylthio group, the arylalkyl group, the arylalkoxy group, the arylalkylthio group, the substituted amino group, the acyloxy group, the amide group, the arylalkenyl group, the arylalkynyl group, and the monovalent heterocyclic group represented by R described above.

The halogen atom represented by R' may be a fluorine atom, a chlorine atom, a bromine atom, or a iodine atom.

The definitions and specific examples of the alkyl group, the cycloalkyl group, the monovalent aromatic hydrocarbon group, the arylalkyl group, the substituted silyl group, the acyl group, and the monovalent heterocyclic group represented by R" are the same as the definitions and specific examples of the alkyl group, the aryl group, the arylalkyl group, the substituted silyl group, the acyl group, and the monovalent heterocyclic group represented by R described above.

The structural unit represented by Formula (I) is preferably a structural unit represented by Formula (III).

[Chemical Formula 21]

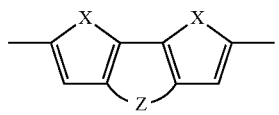
(III)

In Formula (III),

Z represents the same meaning as the above;

X represents an oxygen atom, a sulfur atom, or a selenium atom. A plurality of Xs are the same as or different from each other.

The structural unit represented by Formula (I) is more preferably a structural unit represented by Formula (IV).

[Chemical Formula 22]

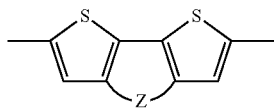
(IV)

In Formula (IV), Z represents the same meaning as the above.

Examples of the structural unit represented by Formula (IV) may include structural units represented by Formulae (501), (502), (503), (504), and (505).

[Chemical Formula 23]

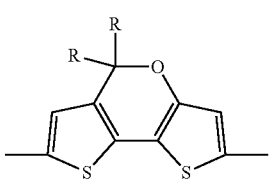
(501)

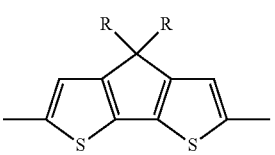
(502)

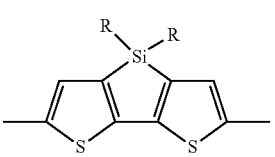
(503)

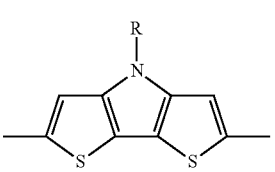
(504)

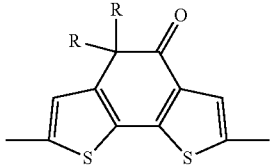
(505)

In viewpoint of obtaining an photoelectric conversion element having higher initial photoelectric conversion efficiency, the structural unit represented by Formula (IV) is preferably the structural unit represented by Formula (501), (502), (503), or (504), more preferably the structural unit represented by Formula (501) or (504), and still more preferably the structural unit represented by Formula (501).

(Structural Unit Represented by Formula (II))

The divalent fused polycyclic aromatic hydrocarbon group or the divalent fused polycyclic aromatic heterocyclic group having a fused ring in which two or more and five or less rings selected from the group consisting of aromatic rings and heteroaromatic rings are fused represented by $Ar^3$ refers to a residual atomic group eliminating two hydrogen atoms directly bonded to a carbon atom forming the fused ring in which two or more and five or less rings selected from the group consisting of aromatic rings and heteroaromatic rings are fused.

The carbon atom number of a divalent fused polycyclic arylene group or a divalent fused polycyclic heteroarylene group is generally 2 to 60, preferably 4 to 60, and more preferably 4 to 20 excluding the carbon atom number of a substituent.

Specific examples of the divalent fused polycyclic aromatic hydrocarbon or the divalent fused polycyclic aromatic heterocyclic group represented by $Ar^3$ may include the following Formula (108) to Formula (181):

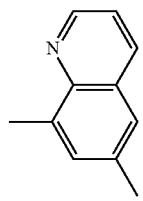
(108)

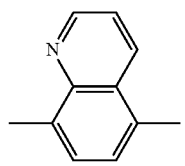
(109)

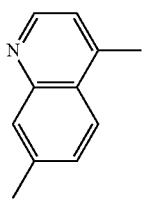
(110)

(111) 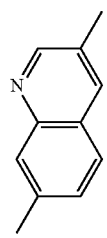
(112) 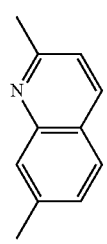
(113) 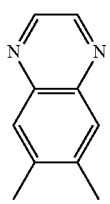
(114) 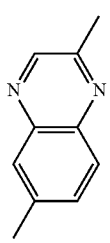
(115) 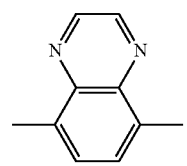
(116) 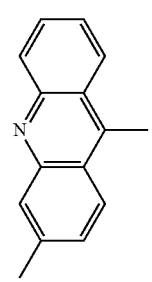
(117) 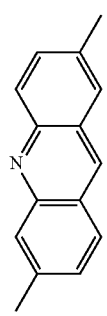
(118) 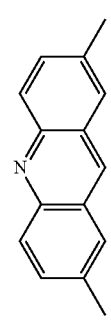
(119) 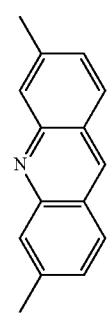
(120) 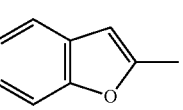
(121) 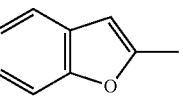
(122) 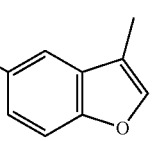
(123) 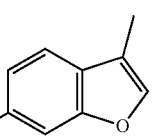
(124) 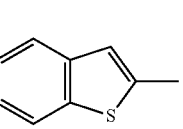

(125) 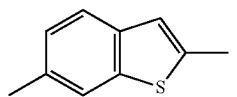

(126) 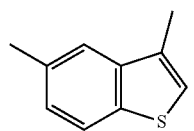

(127) 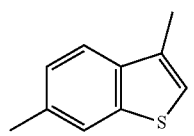

(128) 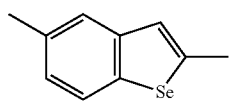

(129) 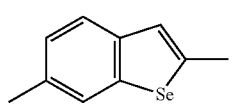

(130) 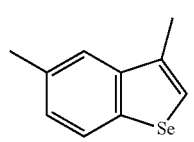

(131) 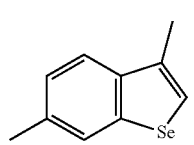

(132) 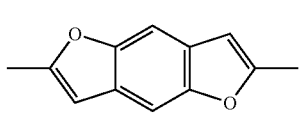

(133) 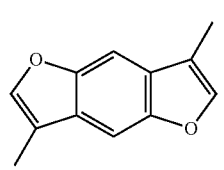

(134) 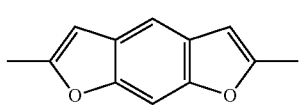

(135) 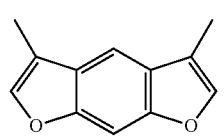

(136) 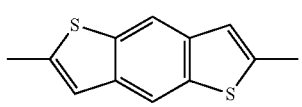

(137) 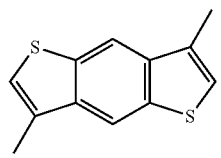

(138) 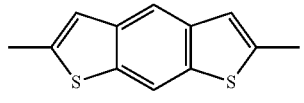

(139) 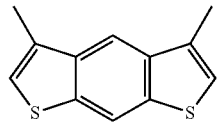

(178) 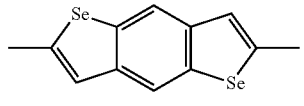

(179) 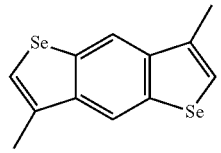

(180) 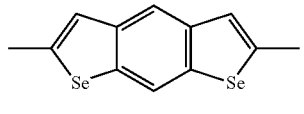

(181) 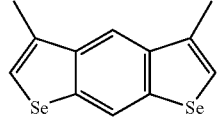

Among the groups represented by Formula (108) to Formula (181), in viewpoint of the easiness of the synthesis of a reactive compound of the present invention, preferred are the groups represented by Formula (109), Formula (111), Formula (113), Formula (115), Formula (120), Formula (121), Formula (124), Formula (125), Formula (128), Formula (129), Formula (132), and Formula (136); more preferred are the groups represented by Formula (120), Formula (121), Formula (124), Formula (125), Formula (132), and Formula (136); and the group represented by Formula (136) is still more preferred.

The structural unit represented by Formula (II) is preferably a compound represented by the following Formula (V) in viewpoint of photoelectric conversion efficiency:

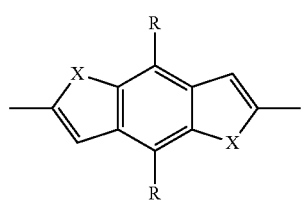

(V)

In the formula,

X and R represent the same meanings as the above;

A plurality of Xs are the same as or different from each other.

A plurality of Rs are the same as or different from each other.

The structural unit represented by Formula (II) is more preferably a structural unit represented by Formula (VI):

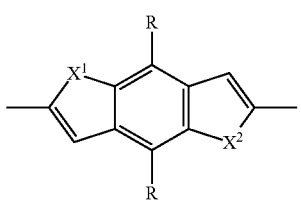

(VI)

In the formula, $X^1$ and $X^2$ each independently represent an oxygen atom or a sulfur atom;

R represent the same meaning as the above.

A plurality of Rs are the same as or different form each other.

In Formula (VI), $X^1$ and $X^2$ are preferably both sulfur atoms.

The active layer may comprise one or more electron donor compounds selected from a compound having the structural unit represented by Formula (I) or Formula (II) as the P-type semiconductor material.

The compound having the structural unit represented by Formula (I) or Formula (II) may further have another structural unit other than the structural unit represented by Formula (I) or Formula (II). Examples of such another structural unit may include a structural unit comprising a residual atomic group obtained by eliminating two or more hydrogen atoms directly bonded to an atom forming a heteroaromatic ring of a heteroaromatic compound such as benzothiazole, difluorobenzothiazole, or thienothiophene.

The compound having the structural unit represented by Formula (I) or Formula (II) may be a polymer compound. The weight average molecular weight of the polymer compound may be 10,000 to 1,000,000, for example.

The polymer compound having the structural unit represented by Formula (I) or Formula (II) may have the structural unit represented by Formula (I) or Formula (II) as a repeating unit. The polymer compound may further have the other structural unit as a repeating unit.

In the polymer compound, the content of the structural unit represented by Formula (I) or Formula (II) is preferably 10% by mass or higher, more preferably 20% by mass or higher, and still more preferably 40% by mass or higher on the basis of the total amount of the polymer compound.

The content of the structural unit represented by Formula (I) or Formula (II) is preferably 90% by mass or lower and more preferably 80% by mass or lower on the basis of the total amount of the polymer compound.

The active layer may comprise another compound other than the compound having the structural unit represented by Formula (I) or Formula (II) as the P-type semiconductor material. Examples of the other compound comprised in the P-type semiconductor material may be electron donor compounds; examples thereof may include antioxidants such as dibutyl hydroxytoluene (BHT), P-type semiconductor polymers such as poly(3-hexylthiophene (P3HT), and P-type low molecular semiconductors.

In the present embodiment, the proportion of the compound having the structural unit represented by Formula (I) or Formula (II) in the total amount of the P-type semiconductor material comprised in the active layer is preferably 10% by mass or higher, more preferably 50% by mass or higher, and may be 100% by mass.

[2] N-Type Semiconductor Material

The N-type semiconductor material comprises an electron acceptor compound.

The electron acceptor compound may be a low molecular compound (a compound with a molecular weight of 2,000 or lower, for example) or a polymer compound. In other words, examples of the N-type semiconductor material may include a low molecular electron acceptor compound and a polymer electron acceptor compound.

Examples of the low molecular electron acceptor compound may include oxadiazole derivatives, anthraquinodimethane and derivatives thereof, benzoquinone and derivatives thereof, naphthoquinone and derivatives thereof, anthraquinone and derivatives thereof, tetracyanoanthraquinodimethane and derivatives thereof, fluorenone derivatives, diphenyldicyanoethylene and derivatives thereof, diphenoquinone derivatives, metal complexes of 8-hydroxyquinoline and derivatives thereof, polyquinoline and derivatives thereof, polyquinoxaline and derivatives thereof, polyfluorene and derivatives thereof, fullerene such as $C_{60}$ and derivatives thereof, and phenanthrene derivatives such as bathocuproine.

Examples of the polymer electron acceptor compound may include polyvinylcarbazole and derivatives thereof, polysilane and derivatives thereof, polysiloxane derivative having aromatic amine on their side chain or main chain, polyaniline and derivatives thereof, polythiophene and derivatives thereof, polypyrrole and derivatives thereof, polyphenylenevinylene and derivatives thereof, polythienylenevinylene and derivatives thereof, and polyfluorene and derivatives thereof.

The electron acceptor compound is preferably fullerene and derivatives thereof. Examples of fullerene may include $C_{60}$ fullerene, $C_{70}$ fullerene, $C_{76}$ fullerene, $C_{78}$ fullerene, and $C_{84}$ fullerene.

Examples of fullerene derivatives may include a fullerene derivative represented by Formula (N-1), a fullerene derivative represented by Formula (N-2), a fullerene derivative represented by Formula (N-3), and a fullerene derivative represented by Formula (N-4).

[Chemical Formula 24]

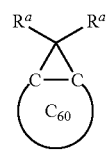

(N-1)

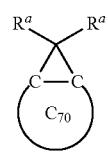

(N-2)

-continued

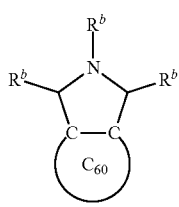
(N-3)

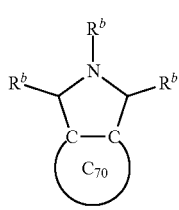
(N-4)

In the formulae, $R^a$ represents an alkyl group optionally having a substituent, a cycloalkyl group optionally having a substituent, a monovalent aromatic hydrocarbon group optionally having a substituent, a monovalent heterocyclic group optionally having a substituent, or a group having an ester structure.

In the formulae, $R^b$ represents an alkyl group optionally having a substituent or a monovalent aromatic hydrocarbon group optionally having a substituent.

A plurality of $R^a$s are the same as or different from each other.

A plurality of $R^b$s are the same as or different from each other.

The definitions and specific examples of the alkyl group optionally having a substituent, the cycloalkyl group optionally having a substituent, the monovalent aromatic hydrocarbon group optionally having a substituent, and the monovalent heterocyclic group optionally having a substituent represented by $R^a$ are the same as the definitions and specific examples of the alkyl group optionally having a substituent, the cycloalkyl group optionally having a substituent, the monovalent aromatic hydrocarbon group optionally having a substituent, and the monovalent heterocyclic group optionally having a substituent represented by R described above.

The group having an ester structure represented by $R^a$ may be a group represented by the following Formula (VII), for example.

[Chemical Formula 25]

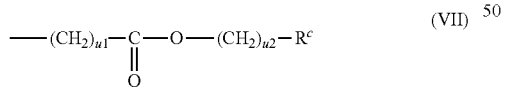
(VII)

In Formula (VII),
u1 represents an integer of 1 to 6;
u2 represents an integer of 0 to 6; and
$R^c$ represents an alkyl group optionally having a substituent, a cycloalkyl group optionally having a substituent, a monovalent aromatic hydrocarbon group optionally having a substituent, or a monovalent heterocyclic group optionally having a substituent.

The definitions and specific examples of the alkyl group optionally having a substituent, the cycloalkyl group optionally having a substituent, the monovalent aromatic hydrocarbon group optionally having a substituent, and the monovalent heterocyclic group optionally having a substituent represented by $R^c$ are the same as the definitions and specific examples of the alkyl group optionally having a substituent, the cycloalkyl group optionally having a substituent, the monovalent aromatic hydrocarbon group optionally having a substituent, and the monovalent heterocyclic group optionally having a substituent represented by R described above.

The definitions and specific examples of the alkyl group optionally having a substituent and the monovalent aromatic hydrocarbon group optionally having a substituent represented by $R^b$ are the same as the definitions and specific examples of the alkyl group optionally having a substituent and the monovalent aromatic hydrocarbon group optionally having a substituent represented by R described above.

Specific examples of the $C_{60}$ fullerene derivative represented by Formula (N-1) or Formula (N-3) may include the following compounds.

[Chemical Formula 26]

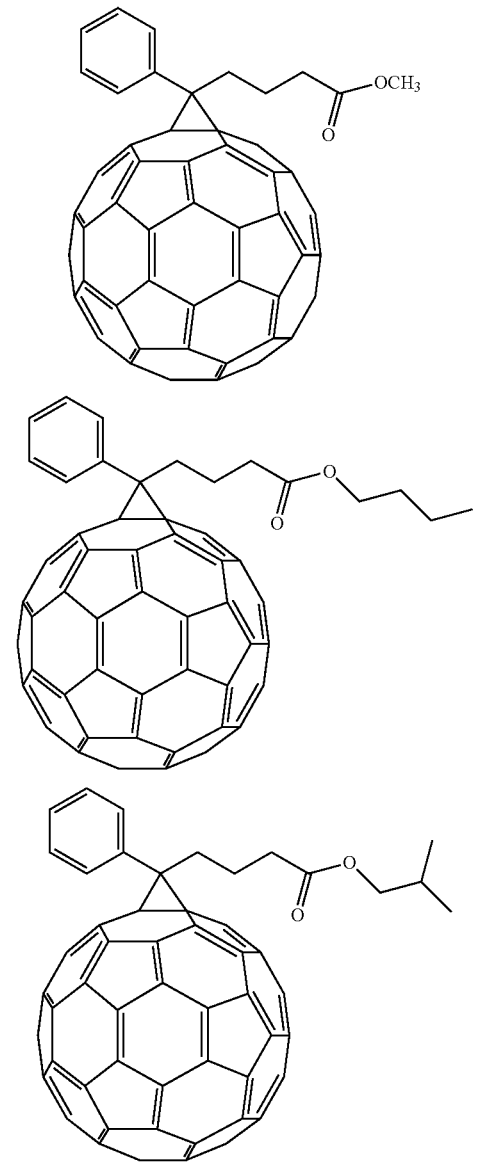

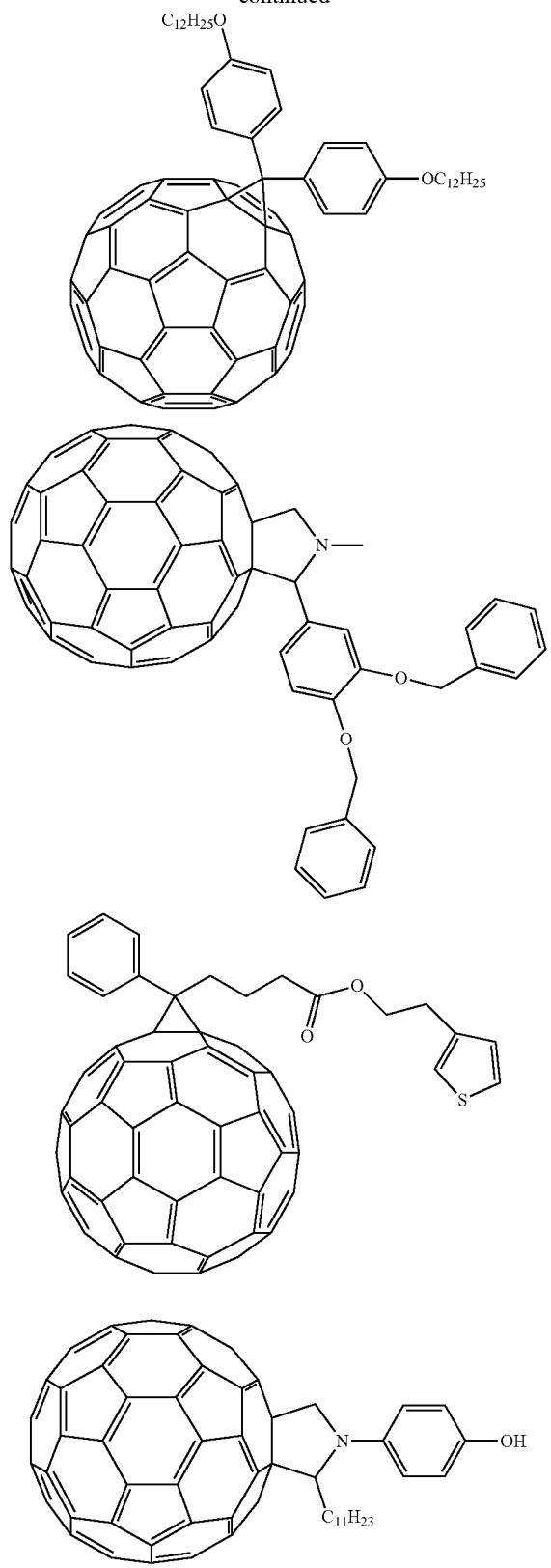

Specific examples of the $C_u$ fullerene derivative represented by Formula (N-2) may include the following compounds.

[Chemical Formula 27]

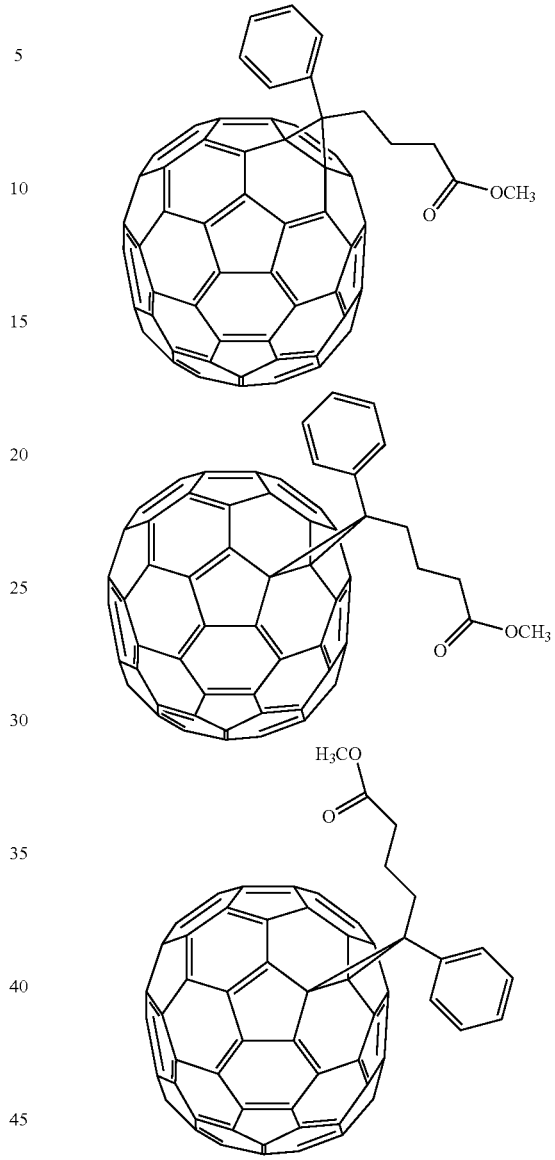

Examples of fullerene derivatives may include [6,6]-phenyl $C_{61}$ butyric acid methyl ester ($C_{60}$ PCBM), [6,6]-phenyl $C_{71}$ butyric acid methyl ester ($C_{70}$ PCBM), [6,6]-phenyl $C_{85}$ butyric acid methyl ester ($C_{84}$ PCBM), and [6,6]-thienyl $C_{61}$ butyric acid methyl ester.

The active layer may comprise one or two or more electron acceptor compounds selected from the group consisting of fullerene and derivatives thereof as the N-type semiconductor material. In this case, the content of the electron acceptor compounds is preferably 10 parts to 1,000 parts by mass and more preferably 50 parts to 500 parts by mass relative to 100 parts by mass of the electron donor compounds comprised in the active layer as the P-type semiconductor material.

The active layer may have a single-layer structure comprising the P-type semiconductor material and the N-type semiconductor material. The active layer may have a multilayer structure such as p/i/n layers; p represents a p-type semiconductor layer, i represents a bulk heterojunction layer, and n represents an n-type semiconductor layer, respectively. Considering that many heterojunction interfaces are comprised, the active layer preferably has the single-layer structure.

The film thickness of the active layer may be 1 nm to 100 μm, for example, preferably 2 nm to 1,000 nm, more preferably 5 nm to 500 nm, and still more preferably 20 nm to 200 nm.

<Layer Comprising a cured product Obtained by Curing Thermosetting Resin Composition>

The organic photoelectric conversion element according to the present invention has the layer comprising a cured product obtained by curing a thermosetting resin composition between the anode and the active layer.

The thermosetting resin composition used in the present invention may comprise a hole transport material.

Examples of the hole transport material may include conductive polymers such as polyvinylcarbazole, polysilane, polythiophene, polyethylenedioxythiophene, polystyrene sulfonate, and a polyethylenedioxythiophene:polystyrene sulfonate (PEDOT:PSS) composition.

The thermosetting resin composition may comprise one or more selected from the group consisting of polythiophene and derivatives thereof and a polymer compound comprising a repeating unit having an aromatic amine residue.

Examples of polythiophene derivatives may include polyethylenedioxythiophene. Examples of the repeating unit having an aromatic amine residue may include polyaniline and derivatives thereof and polyvinylcarbazole.

The thermosetting resin composition preferably comprises one or more compounds having one or more groups selected from the following Group A:

Group A: a group having a double bond, a group having benzocyclobutene, a group having a cyclic ether, a group having a cyclic amide, a group having an ester structure, and a group having a hydroxy group.

Herein, the group having a double bond may be an alkenyl group, an alkadienyl group, or an alkenylphenyl group.

The group having benzocyclobutene has a group obtained by eliminating one hydrogen atom on a benzene ring from benzocyclobutene and may have an alkyl group, an alkoxy group, or the like as a substituent on the benzene ring.

The cyclic ether in the group having a cyclic ether may be oxirane or oxetane.

The cyclic amide in the group having a cyclic amide may be pyrrolidone.

Specific examples of the group selected from Group A may include groups represented by the following Formula (B-1) to (B-24).

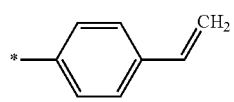

B-1

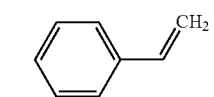

B-2

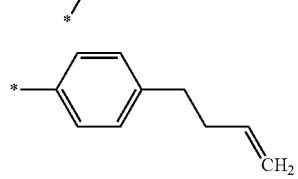

B-3

-continued

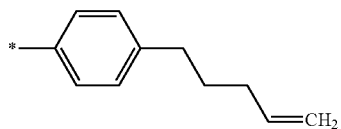

B-4

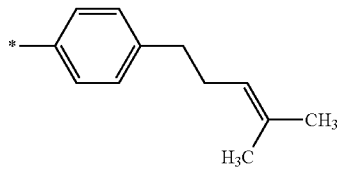

B-5

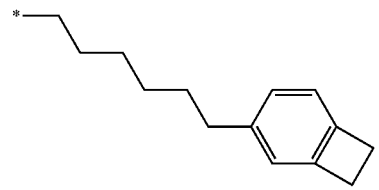

B-6

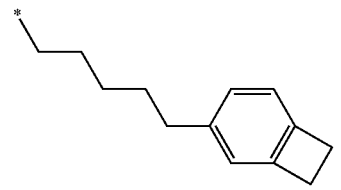

B-7

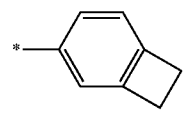

B-8

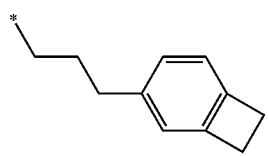

B-9

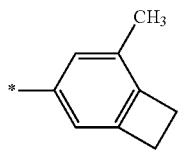

B-10

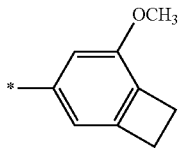

B-11

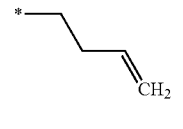

B-12

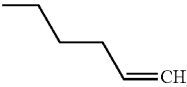

B-13

-continued

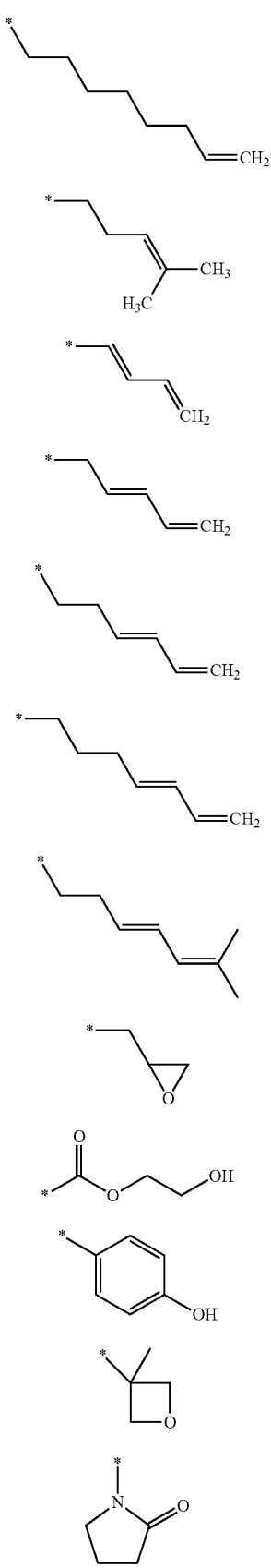

The compound having one or more groups selected from Group A may be a polymer compound or a low molecular compound.

The compound having one or more groups selected from Group A may be a hole transport material.

The compound having one or more groups selected from Group A may be a derivative of polythiophene.

The compound having one or more groups selected from Group A may be a polymer compound comprising a repeating unit having an aromatic amine residue.

Examples of the compound having one or more groups selected from Group A may include polyhydroxyethyl methacrylate (PHEA), polyhydroxyethyl acrylate, polyvinylphenol, and polyvinylpyrrolidone.

Examples of the thermosetting resin composition may include a composition comprising a hole transport material that does not have any groups selected from Group A and a compound having one or more groups selected from Group A and a composition comprising a hole transport material having one or more groups selected from Group A.

The amount of use of the compound having one or more groups selected from Group A is generally preferably 10 parts to 1,000 parts by mass relative to 100 parts by mass of the hole transport material that does not have any groups selected from Group A; the amount of use of the compound having one or more groups selected from Group A is generally preferably 0 part to 1,000 parts by mass relative to 100 parts by mass of the hole transport material.

The thermosetting resin composition may be a composition comprising one or more polymer compounds selected from the group consisting of polythiophene and derivatives thereof that do not have any groups selected from Group A and a polymer compound comprising a repeating unit having an aromatic amine residue and a compound having one or more groups selected from Group A and one or more polymer compounds selected from the group consisting of a derivative of polythiophene having a group selected from Group A and a polymer compound comprising a repeating unit having an aromatic amine residue.

The amount of use of the compound having one or more groups selected from Group A is generally preferably 10 parts to 1,000 parts by mass relative to 100 parts by mass of the one or more polymer compounds selected from the group consisting of polythiophene and derivatives thereof that do not have any groups selected from Group A and a polymer compound comprising a repeating unit having an aromatic amine residue; the amount of use of the compound having one or more groups selected from Group A is generally preferably 0 part to 1,000 parts by mass relative to 100 part by mass of the one or more polymer compounds selected from the group consisting of a derivative of polythiophene and a polymer compound comprising a repeating unit having an aromatic amine residue.

Examples of the thermosetting resin composition may include a composition comprising one or more selected from the group consisting of conductive polymers such as polyvinylcarbazole, polysilane, polythiophene, polyethylenedioxythiophene, and a polyethylenedioxythiophene:polystyrene sulfonate (PEDOT:PSS) composition and one or more selected from the group consisting of polyhydroxyethyl methacrylate (PHEA), polyhydroxyethyl acrylate, polyvinylphenol, and polyvinylpyrrolidone.

The thermosetting resin composition may comprise a surfactant. Examples of the surfactant may include fluorine surfactants (product name: Zonyl FS-300, for example); and ionic surfactants such as sodium dodecyl sulfate, hexadecyltrimethylammonium bromide, and N-dodecyl-N,N-dimethyl-3-ammonio-1-propane sulfonic acid. The amount of use of the surfactant is generally 0.1 part to 100 parts by mass relative to 100 parts by mass of the hole transport material.

The thermosetting resin composition may comprise a solvent. Examples of the solvent may include water, ethanol, butanol, and ethylene glycol.

The amount of use of the solvent is generally 10 parts to 10,000 parts by mass relative to 100 parts by mass of the hole transport material.

The thermosetting resin composition is preferably a thermosetting resin composition in which the difference between the residual film ratio of a layer comprising a cured product obtained by heating the thermosetting resin composition for 5 minutes on a hot plate heated at 150° C. under a nitrogen atmosphere and the residual film ratio of a layer comprising a cured product obtained by heating the thermosetting resin composition for 5 minutes on a hot plate heated at 70° C. under a nitrogen atmosphere is 20% or higher and 90% or lower and the value of the residual film ratio of the layer comprising a cured product obtained by heating the thermosetting resin composition for 5 minutes on a hot plate heated at 150° C. under a nitrogen atmosphere is 80% or higher in the following measurement of residual film ratio.

<Measurement of Residual Film Ratio>

Two films for residual film ratio measurement are formed.

The films for residual film ratio measurement are each made by the substantially same method of application as that of the layer comprising a cured product obtained by curing a thermosetting resin composition using the substantially same materials as those of the layer comprising a cured product obtained by curing a thermosetting resin composition of the organic photoelectric conversion element of the present invention on a one-by-one-inch square supporting substrate. The films for ionization energy measurement each have the substantially same thickness as that of the layer comprising a cured product obtained by curing a thermosetting resin composition. One of the obtained two films for residual film ratio measurement is heated for 5 minutes on a hot plate heated at 150° C. under a nitrogen atmosphere, whereas the other thereof is heated for 5 minutes on a hot plate heated at 70° C. under a nitrogen atmosphere. For each of the films for measurement after being heated, the thickness of the film is measured with a stylus film thickness meter to define it as the thickness of the film before ethanol rinsing treatment. Ethanol is placed on each of the films for measurement after the measurement of the thickness of the film so as to form a meniscus, and after being left at rest for 30 seconds, spinning is performed with a spin coater at 4,000 rpm for 30 seconds to shake off the ethanol, whereby ethanol rinsing treatment is performed. For each of the films for measurement after the ethanol rinsing treatment, the thickness of the film is measured with a stylus film thickness meter to define it as the thickness of the film after ethanol rinsing treatment.

The values (%) of (the thickness of the film after ethanol rinsing treatment)/(the thickness of the film before ethanol rinsing treatment)×100 obtained by the individual heating conditions are defined as residual film ratios on the individual heating conditions.

More specifically, the film for residual film ratio measurement is a film having the substantially same thickness (within ±10%) as that of the layer comprising a cured product obtained by curing a thermosetting resin composition obtained by applying an application liquid having the same concentration as that used when the layer comprising a cured product obtained by curing a thermosetting resin composition is formed that is formed using the same thermosetting resin composition and solvent as those used when the layer comprising a cured product obtained by curing a thermosetting resin composition is formed to a supporting substrate.

Herein, "the same thermosetting resin composition as that used when the layer comprising a cured product obtained by curing a thermosetting resin composition is formed" means that they are only required to be the same as each other in all compounds comprised in the thermosetting resin composition that have an influence on measurement results of ionization energy. In other words, when a surfactant is comprised as a compound that does not have any influence on measurement results of ionization energy in the thermosetting resin composition used when the layer comprising a cured product obtained by curing a thermosetting resin composition is formed, the thermosetting resin composition used for the making of a film for ionization energy measurement does not necessarily comprise the surfactant.

When the thermosetting resin composition used when the layer comprising a cured product obtained by curing a thermosetting resin composition is formed comprises the surfactant, "the application liquid having the same concentration as that used when the layer comprising a cured product obtained by curing a thermosetting resin composition is formed" is only required to be an application liquid being the same in the concentration of the application liquid comprising the thermosetting resin composition except the surfactant and the solvent.

The thermosetting resin composition is more preferably a thermosetting resin composition in which the residual film ratio of the layer comprising a cured product obtained by heating the thermosetting resin composition for 5 minutes on a hot plate heated at 150° C. under a nitrogen atmosphere is 90% or higher.

When ethanol is placed on the film for residual film ratio measurement, it is placed so as to form a meniscus, whereby the ethanol can be placed so as to cover the substantially entire surface of the film.

That the ethanol has been shaken off can be determined visually.

When the thickness of the film is measured with the stylus film thickness meter, the area to be measured is the central part of the one-by-one-inch square substrate.

The layer comprising a cured product obtained by curing a thermosetting resin composition preferably has an ionization energy change before and after water rinsing treatment of −0.1 eV or higher and 0.1 eV or lower in the measurement of ionization energy before and after the following water rinsing treatment.

<Measurement of Ionization Energy before and after Water Rinsing Treatment>

Two films for ionization energy measurement are formed.

The films for ionization energy measurement are each formed by the substantially same method as that of the layer comprising a cured product obtained by curing a thermosetting resin composition using the substantially same materials as those of the layer comprising a cured product obtained by curing a thermosetting resin composition of the organic photoelectric conversion element of the present invention on a one-by-one-inch square supporting substrate. The films for ionization energy measurement each have the substantially same thickness as that of the layer comprising a cured product obtained by curing a thermosetting resin composition.

For one of the films for ionization energy measurement, ionization energy is measured with a photoelectron spectrometer, and the obtained value is defined as ionization energy before water rinsing treatment. Water is placed on the other of the films for ionization energy measurement so as to form a meniscus, and after being left at rest for 10 seconds, spinning is performed with a spin coater at 4,000 rpm for 30 seconds to shake off the water, whereby water rinsing treatment is performed. For the film for ionization energy measurement after the water rinsing treatment, ionization energy is measured with a photoelectron spectrometer, and the obtained value is defined as ionization energy after water rinsing treatment. The value of (the ionization energy after water rinsing treatment)−(the ionization energy before water rinsing treatment) is defined as an ionization energy change before and after water rinsing treatment.

The ionization energy change before and after water rinsing treatment is preferably −0.05 eV or higher and 0.05 eV or lower.

More specifically, the film for ionization energy measurement is a film having the substantially same thickness (within ±10%) as that of the layer comprising a cured product obtained by curing a thermosetting resin composition obtained by making a liquid using the same thermosetting resin composition and solvent as those used when the layer comprising a cured product obtained by curing a thermosetting resin composition is formed, applying an application liquid having the same concentration as that used when the layer comprising a cured product obtained by curing a thermosetting resin composition is formed to a supporting substrate, and heating the obtained film at the same temperature, for the same time, and under the same atmosphere as those when the layer comprising a cured product obtained by curing a thermosetting resin composition is formed.

"The same thermosetting resin composition as that used when the layer comprising a cured product obtained by curing a thermosetting resin composition is formed" means that they are only required to be the same as each other in all compounds that have an influence on measurement results of ionization energy comprised in the thermosetting resin composition. In other words, when a surfactant is comprised as a compound that does not have any influence on measurement results of ionization energy in the thermosetting resin composition used when the layer comprising a cured product obtained by curing a thermosetting resin composition is formed, the thermosetting resin composition used for the forming of the film for ionization energy measurement does not necessarily comprise the surfactant.

When the thermosetting resin composition used when the layer comprising a cured product obtained by curing a thermosetting resin composition is formed comprises the surfactant, "the application liquid having the same concentration as that used when the layer comprising a cured product obtained by curing a thermosetting resin composition is formed" is only required to be an application liquid being the same in the concentration of the application liquid comprising the thermosetting resin composition except the surfactant and the solvent.

When water is placed on the film for ionization energy measurement, it is placed so as to form a meniscus, whereby the water can be placed so as to cover the substantially entire surface of the film.

That the water has been shaken off can be determined visually.

When ionization energy is measured with the photoelectron spectrometer, the area to be measured is the central part of the one-by-one-inch square substrate.

Examples of the material of the layer comprising a cured product obtained by curing a thermosetting resin composition having an ionization energy change before and after water rinsing treatment of −0.1 eV or higher and 0.1 eV or lower in the measurement of ionization energy before and after the water rinsing treatment may include a composition comprising one or more selected from the group consisting of polythiophene and derivatives thereof and a polymer compound comprising a repeating unit having an aromatic amine residue.

Polythiophene derivatives and the polymer compound comprising a repeating unit having an aromatic amine residue optionally have one or more selected from the group consisting of a group having an ester structure, a hydroxy group, and an ethylenedioxy group, for example, as a substituent. Polythiophene derivatives may be PEDOT.

The thickness of the layer comprising a cured product obtained by curing a thermosetting resin composition may be 0.1 nm or larger or 1 nm or larger, for example. The thickness of the layer comprising a cured product obtained by curing a thermosetting resin composition may be 300 nm or smaller or 100 nm or smaller, for example.

The layer comprising a cured product obtained by curing a thermosetting resin composition may be a single layer or a plurality of layers.

<Electron Transport Layer>

The organic photoelectric conversion element according to the present embodiment may have the electron transport layer between the cathode and the active layer.

The electron transport layer may be a layer comprising known electron transport materials. Examples of the electron transport materials may include zinc oxide, titanium oxide, zirconium oxide, tin oxide, indium oxide, ITO (indium tin oxide), FTO (fluorine-doped tin oxide), GZO (gallium-doped zinc oxide), ATO (antimony-doped tin oxide), AZO (aluminum-doped zinc oxide), PEIE (polyethyleneimine ethoxylated), and PEI (polyethyleneimine). In viewpoint of exhibiting higher photoelectric conversion efficiency, the electron transport layer preferably comprises PEIE.

In the organic photoelectric conversion element according to the present invention, the electron transport layer is provided between the cathode and the active layer, whereby the cathode can be prevented from peeling, and electron extraction efficiency from the active layer to the cathode can be increased. The electron transport layer is preferably provided in contact with the active layer and is, in addition, preferably provided also in contact with the cathode. Such an electron transport layer is provided, whereby an photoelectric conversion element having high reliability and higher photoelectric conversion element can be achieved.

The electron transport layer comprising the electron transport material can improve electron injection efficiency to the cathode, prevent holes from being injected from the active layer, improve electron transport capability, protect the active layer from corrosion caused by an application liquid used when the cathode is formed by application, and inhibit the degradation of the active layer.

The electron transport layer is preferably formed of a material having high wettability relative to the application liquid used when the cathode is formed by application. Specifically, the wettability of the electron transport layer relative to the application liquid used when the cathode is formed by application is preferably higher than the wettability of the active layer relative to the application liquid used when the cathode is formed by application. The cathode is formed by application on such an electron transport layer, whereby when the cathode is formed, the application liquid favorably wets and spreads on the surface of the electron transport layer, and the cathode having a uniform thickness can be formed.

The film thickness of the electron transport layer may be 0.1 nm or larger or 1 nm or larger, for example.

Moreover, the film thickness of the electron transport layer may be 300 nm or smaller or 100 nm or smaller, for example.

The electron transport layer may be a single layer or a plurality of layers.

The electron transport layer in contact with the cathode is preferably a layer comprising zinc oxide, titanium oxide, gallium-doped zinc oxide (GZO), antimony-doped tin oxide (ATO), or aluminum-doped zinc oxide (AZO).

<2> Method for Manufacturing Organic Photoelectric Conversion Element

Examples of a method for manufacturing an organic photoelectric conversion element may include a method for manufacturing an organic photoelectric conversion element comprising a step of forming the cathode, a step of forming the active layer, a step of forming the layer comprising a cured product obtained by curing a thermosetting resin composition, and a step of forming the anode in this order and a method for manufacturing an organic photoelectric conversion element comprising a step of forming the anode, a step of forming the layer comprising a cured product obtained by curing a thermosetting resin composition, a step of forming the active layer, and a step of forming the cathode in this order.

The method for manufacturing an organic photoelectric conversion element may further comprise a step of forming the electron transport layer.

In the method for manufacturing an organic photoelectric conversion element, the step of forming the electron transport layer is generally comprised between the step of forming the cathode and the step of forming the active layer.

The following describes the steps of forming the individual layers of the organic photoelectric conversion element according to the present invention.

<Step of Forming Electrodes>

The first electrode can be formed using the material of the first material described above by vacuum evaporation method, sputtering method, ion plating method, or plating method, for example.

The second electrode can be formed by forming a metallic nanowire layer by application method or by forming a metallic thin film by vapor deposition, for example.

The metallic nanowire layer can be obtained by applying an application liquid comprising metallic nanowires and drying it, for example. The application liquid may be a solution or a dispersion liquid such as an emulsion or a suspension.

A method for applying the application liquid and a method for forming an applied film may be application methods such as slit coatingmethod, knife coatingmethod, spin coatingmethod, casting method, microgravure coating method, gravure coatingmethod, bar coatingmethod, roll coatingmethod, wire bar coatingmethod, dip coatingmethod, spray coatingmethod, screen printing method, gravure printing method, flexographic printing method, offset printing method, inkjet coating method, dispenser printing method, nozzle coating method, or capillary coating method. Among them, preferably used are slit coating method, capillary coating method, gravure coating method, microgravure coating method, bar coating method, knife coating method, nozzle coating method, inkjet coating method, and spin coating method.

<Step of Forming Active Layer>

The active layer can be formed by forming an applied film from a solution (ink) comprising the materials comprised in the active layer described above and a solvent and performing drying and the like as needed to form a film, for example.

The solution can be prepared by dissolving the P-type semiconductor material and the N-type semiconductor material in the solvent. For the preparation, in viewpoint of obtaining the uniformity of the solution, dissolving is preferably performed under conditions of 60° C. or higher and 10 hours or longer, for example.

The solvent comprised in the solution for forming the active layer may be solvents capable of dissolving the compound having the structural unit represented by Formula (I) or Formula (II). Examples of the solvent may include unsaturated hydrocarbon solvents such as toluene, xylene, mesitylene, 1,2,4-trimethylbenzene, tetralin, indane, decalin, bicyclohexyl, n-butylbenzene, sec-butylbenzene, tert-butylbenzene, and methylnaphthalene; halogenated saturated hydrocarbon solvents such as carbon tetrachloride, chloroform, dichloromethane, dichloroethane, chlorobutane, bromobutane, chloropentane, bromopentane, chlorohexane, bromohexane, chlorocyclohexane, and bromocyclohexane; halogenated unsaturated hydrocarbon solvents such as chlorobenzene, dichlorobenzene, trichlorobenzene, and chloronaphthalene; and ether solvents such as tetrahydrofuran and tetrahydropyran.

When the active layer comprises a polymer compound having the structural unit represented by Formula (I) as the P-type semiconductor material, the solution for forming the active layer may comprise the P-type semiconductor material and the N-type semiconductor material and comprise the polymer compound having the structural unit represented by Formula (I) in an amount of 0.1% by mass or more relative to the mass of the solution.

<Step of Forming Layer Comprising Cured Product Obtained by Curing Thermosetting Resin Composition>

The layer comprising a cured product obtained by curing a thermosetting resin composition can be formed by forming a film from an application liquid comprising a thermosetting resin composition and a solvent and heating the obtained film, for example.

The application liquid may be a solution or a dispersion liquid such as an emulsion or a suspension.

The solvent of the application solution may be a solvent capable of dispersing or dissolving the material to be applied.

Examples of the solvent comprised in the application liquid may include water and organic solvents such as water, ethanol, isopropanol, 3-pentanol, ortho-dichlorobenzene, tetralin, and 1,2,4-trimethylbenzene.

As a method of film formation from the application liquid, application methods such as slit coating method, knife coatingmethod, spin coatingmethod, casting method, microgravure coatingmethod, gravure coating method, bar coating method, roll coating method, wire bar coating method, dip coating method, spray coating method, screen printingmethod, gravure printingmethod, flexographic printingmethod, offset printingmethod, inkjet coating method, dispenser printing method, nozzle coating method, and capillary coatingmethod may be used. Among them, it may be slit coating method, capillary coating method, gravure coatingmethod, microgravure coatingmethod, bar coatingmethod, knife coatingmethod, nozzle coating method, inkjet coatingmethod, or spin coating method.

A method of heating may be use of a hot plate or an oven.

The heating is preferably performed at 130° C. to 180° C., for 2 minutes to 20 minutes, and under a nitrogen atmosphere and more preferably performed at 140° C. to 160° C., for 3 minutes to 5 minutes, and under a nitrogen atmosphere.

<Step of Forming Electron Transport Layer>

The electron transport layer can be formed by film formation from an application liquid comprising the electron transport material and a solvent, for example.

The application liquid may be a solution or a dispersion liquid such as an emulsion or a suspension.

The solvent comprised in the application liquid may be a solvent capable of dispersing or dissolving the electron transport material.

The solvent comprised in the application liquid may be water or alcohol solvents such as methanol, ethanol, and isopropanol.

A method of film formation, that is, a method of film formation from the application liquid may be application methods such as slit coating method, knife coating method, spin coating method, casting method, microgravure coating method, gravure coating method, bar coating method, roll coating method, wire bar coating method, dip coating method, spray coating method, screen printing method, gravure printing method, flexographic printing method, offset printing method, inkjet coating method, dispenser printing method, nozzle coating method, or capillary coating method. Among them, it may be slit coating method, capillary coating method, gravure coating method, microgravure coating method, bar coating method, knife coating method, nozzle coating method, inkjet coating method, or spin coating method.

<3> Uses of Organic Photoelectric Conversion Element

By being irradiated with light such as sunlight, the organic photoelectric conversion element according to the present invention generates photovoltaic power between the electrodes and can be operated as an organic thin film solar cell.

A plurality of organic photoelectric conversion elements according to the present invention are integrated, whereby they can also be used as a solar cell module.

The organic thin film solar cell can have a module structure basically similar to those of conventional solar cell modules. A solar cell module generally has a structure in which cells are formed on a supporting substrate formed of metal, ceramics, or the like, which is covered with filling resin, protective glass, or the like, and light is taken in from the opposite side of the supporting substrate. However, a structure in which a transparent material such as reinforced glass is used for the supporting substrate, cells are formed thereon, and light is taken in from the transparent supporting substrate side can also be taken. Specifically, module structures called superstrate type, substrate type, and potting type and a substrate-integrated module structure used in amorphous silicon solar cells and the like are known. The organic thin film solar cell by the organic photoelectric conversion element according to the present embodiment can also select any of these modules as appropriate depending on its purpose of use, place for use, and environment.

In a representative superstrate type or substrate type module, cells are arranged at regular intervals between supporting substrates the one side or both sides of which are transparent and are subjected to antireflective treatment, adjacent cells are connected to each other with metallic leads or flexible wiring, and current collecting electrodes are arranged on an outside part, forming a structure that causes generated electric power to be taken out to the outside. For the purpose of protecting the cells and improving current collecting efficiency, various kinds of plastic materials such as ethylene vinyl acetate (EVA) may be arranged in the form of film or filling resin between the substrates and the cells depending on purposes.

When the module is used at a place in which there is no need to cover the surface with a hard material such as a place with less external impact, a surface protective layer is formed of a transparent plastic film, or protective function is imparted by curing the filling resin, whereby one side of the supporting substrates can be eliminated. The surrounding of the supporting substrates is fixed by a metallic frame in a sandwich manner in order to ensure internal sealing and the stiffness of the module, and a sealing material hermetically seals between the supporting substrates and the frame. When flexible materials are used for the cells themselves, the supporting substrates, a filling material, and the sealing material, a solar cell can also be formed on a curved surface. For a solar cell using a flexible support such as a polymer film, cells are successively formed while a roll-shaped support is sent out, the support is cut into a desired size, and the peripheral part is sealed with a flexible, moisture-proof material, whereby a cell body can be manufactured. Another possible structure is a module structure called "SCAF" described in Solar Energy Materials and Solar Cells, 48, p. 383-391. Furthermore, the solar cell using the flexible support can also be bonded and fixed to curved glass or the like.

The organic photoelectric conversion element according to the present invention passes a photocurrent by being irradiated with light with or without voltage applied between the electrodes and can thus be operated as an organic photosensor. A plurality of organic photosensors are integrated, whereby they can also be used as an organic image sensor.

The preferred embodiment of the present invention has been so far described. However, the present invention is not limited to the embodiment described above.

EXAMPLES

The following describes the present invention more specifically with reference to Examples. However, the present invention is not limited to the Examples.

(Measurement of Ionization Energy) (Ionization Energy of LVW1041 (before Water Rinsing Treatment))

A resin composition Clevios LVW1041 (manufactured by Heraeus) was applied to a 1-inch square glass substrate by spin coating so as to be a thickness of 40 nm. Subsequently, the obtained film was heated for 5 minutes on a hot plate heated at 150° C. under a nitrogen atmosphere to form a film for ionization energy measurement. The ionization energy of the obtained film for ionization energy measurement (a thin film of LVW1041) was measured with a photoelectron spectrometer AC-2 (Riken Keiki Co., Ltd.), which was 5.11 eV.

(Ionization Energy of LVW1041 (after Water Rinsing Treatment))

A resin composition Clevios LVW1041 (manufactured by Heraeus) was applied to a 1-inch square glass substrate by spin coating so as to be a thickness of 40 nm. Subsequently, the obtained film was heated for 5 minutes on a hot plate heated at 150° C. under a nitrogen atmosphere to form a film for ionization energy measurement. Subsequently, water was placed on this applied film so as to form a meniscus, and after 10 seconds, spinning was performed at 4,000 rpm to shake off the water. The ionization energy of the obtained film of LVW1041 was measured with a photoelectron spectrometer AC-2 (Riken Keiki Co., Ltd.), which was 5.16 eV.

(Ionization Energy of AI4083)

A film for ionization energy measurement with a thickness of 40 nm was formed in a similar manner except that a resin composition Clevios P AI4083 (manufactured by Heraeus) was used in place of the resin composition Clevios LVW1041, and the ionization energy was measured. The value of the ionization energy before water rinsing treatment was 5.24 eV, whereas the value of the ionization energy after water rinsing treatment was 5.09 eV.

(Ionization Energy of AI4083+Polyhydroxyethyl Methacrylate (PHEA))

A film for ionization energy measurement with a thickness of 40 nm was formed in a similar manner except that a composition in which polyhydroxyethyl methacrylate (manufactured by Aldrich) had been added to Clevios P AI4083 (manufactured by Heraeus) so as to be 50 wt % in a dried film was used in place of the resin composition Clevios LVW1041, and the ionization energy was measured. The value of the ionization energy before water rinsing treatment was 5.28 eV, whereas the value of the ionization energy after water rinsing treatment was 5.26 eV.

(Measurement of Residual Film Ratio by Ethanol Rinsing)

(Residual Film Ratio of LVW1041)

Clevios LVW1041 (manufactured by Heraeus) was applied to a one-by-one-inch square substrate by spin coating and was heated and dried for 5 minutes on a hot plate heated at 150° C. under a nitrogen atmosphere to form a film for measurement with a thickness of 53 nm. Next, ethanol was placed on this film for measurement so as to form a meniscus, and after being left at rest for 30 seconds, spinning was performed at 4,000 rpm for 30 seconds to shake off the ethanol. The thickness of the film for measurement after ethanol rinsing treatment was 51 nm. Thus, the residual film ratio of the film for measurement was 96%.

(Residual Film Ratio of LVW1041)

Clevios LVW1041 (manufactured by Heraeus) was applied to a one-by-one-inch square substrate by spin coating and was heated and dried for 5 minutes on a hot plate heated at 70° C. under a nitrogen atmosphere to form a film for measurement with a thickness of 55 nm. Next, ethanol was placed on this film for measurement so as to form a meniscus, and after being left at rest for 30 seconds, spinning was performed at 4,000 rpm for 30 seconds to shake off the ethanol. The thickness of the film for measurement after ethanol rinsing treatment was 38 nm; thus, the residual film ratio of the film for measurement was 69%.

(Residual Film Ratio of A14083+Polyhydroxyethyl methacrylate (PHEA))

Measurement was performed in a manner similar to the above except that a composition in which polyhydroxyethyl methacrylate (manufactured by Aldrich) had been added to Clevios P A14083 (manufactured by Heraeus) so as to cause a dried film to have a percentage by weight of 50% was used in place of Clevios LVW1041.

The thickness of the film for measurement before ethanol rinsing treatment obtained by being heated and dried for 5 minutes on a hot plate heated at 150° C. under a nitrogen atmosphere was 38 nm, whereas the thickness of the film for measurement after ethanol rinsing treatment was 35 nm. Thus, the residual film ratio of the film for measurement under the heating condition (150° C. for 5 minutes under a nitrogen atmosphere) was 92%.

On the other hand, the thickness of the film for measurement before ethanol rinsing treatment obtained by being heated and dried for 5 minutes on a hot plate heated at 70° C. under a nitrogen atmosphere was 40 nm, whereas the thickness of the film for measurement after ethanol rinsing treatment was 16 nm. Thus, the residual film ratio of the film for measurement under the heating condition (70° C. for 5 minutes under a nitrogen atmosphere) was 40%.

(Residual Film Ratio of A14083)

Measurement was performed in a manner similar to the above except that Clevios P A14083 (manufactured by Heraeus) was used in place of Clevios LVW1041. The thickness of the film for measurement before ethanol rinsing treatment obtained by being heated and dried for 5 minutes on a hot plate heated at 150° C. under a nitrogen atmosphere was 30 nm, whereas thickness after ethanol rinsing treatment was unable to be detected. Thus, the residual film ratio of the film for measurement under the heating condition was 0%.

Example 1

(Synthesis of Polymer Compound A)

As a polymer compound having the structural unit represented by Formula (I), Polymer Compound A comprising the following structural units was synthesized by a method described in Example 1 of WO 2013/051676.

[Chemical Formula 28]

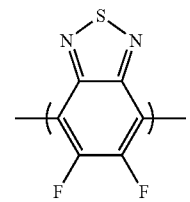

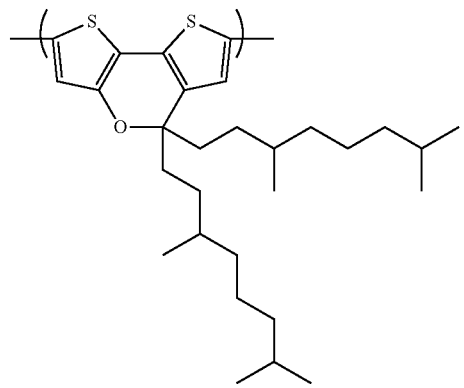

-continued

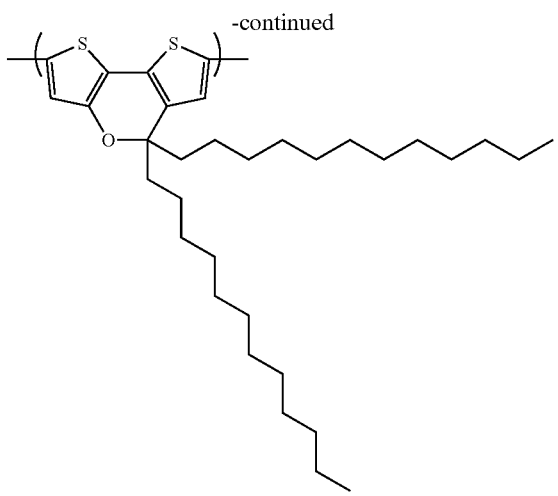

(Preparation of Ink 1)

Polymer Compound A and fullerene $C_{60}$ PCBM (phenyl $C_{61}$-butyric acid methyl ester) were dissolved in a mixed solvent of trimethylbenzene/propiophenone, which was stirred at 50° C. for 12 hours to prepare Ink 1. In Ink 1, the ratio (mass ratio) of the content of $C_{60}$ PCBM to the content of Polymer Compound A was 2.5. In Ink 1, the total content of Polymer Compound A and $C_{60}$ PCBM was 3.5% by mass on the basis of the total amount of Ink 1.

(Manufacturing and Evaluation of Transparent Organic Photoelectric Conversion Element 1)

A glass substrate formed with an ITO thin film functioning as a cathode of a solar cell was prepared. The ITO thin film was formed by sputtering method, and its thickness was 150 nm. This glass substrate was treated with ozone UV to perform surface treatment on the ITO thin film. Next, an aqueous PEIE (polyethyleneimine ethoxylated) solution was applied to the ITO thin film by spin coating and was heated for 10 minutes at 120° C. in the atmosphere to form an electron transport layer with a film thickness of 5 nm or smaller. Ink 1 was applied to this electron transport layer by spin coating and was heated for 5 minutes on a hot plate heated at 150° C. under a nitrogen atmosphere to form an active layer (film thickness: about 180 nm).

Next, a composition in which 0.5% of Zonyl (registered trademark) FS-300 (manufactured by Aldrich) had been added as a surfactant to Clevios LVW1041 (manufactured by Heraeus) was applied to the active layer with a film thickness of 50 nm by spin coating and was dried under a nitrogen atmosphere. Subsequently, the obtained film was heated for 5 minutes on a hot plate heated at 150° C. under a nitrogen atmosphere to form a layer comprising a cured product obtained by curing a thermosetting reins composition.

Next, an aqueous-solvent, wire-shaped conductor dispersion liquid (AgNW; ClearOhm (registered trademark) Ink-N AQ manufactured by Cambrios Technologies Corporation) was applied by spin coater and was dried to obtain a silver nanowire layer with a film thickness of 120 nm. Subsequently, a UV-curing sealant was applied to the periphery of a sealing glass substrate, the glass substrates were bonded to each other, and UV light was radiated to seal the glass substrates.

The shape of the obtained organic photoelectric conversion element was a 10 mm×10 mm square. Subsequently, using a pseudo-sunlight irradiation apparatus (product name: Model CEP-2000 spectral response measurement system manufactured by Bunkoukeiki Co., Ltd.), the current-voltage characteristics of the obtained organic photoelectric conversion element were measured while being irradiated with white light (a xenon lamp) to determine short-circuit current density, open end voltage, fill factor (curve factor), and photoelectric conversion efficiency. The light quantity of the white light was adjusted to 100 mW/cm² (AM1.5G) by measuring the output of a standard solar cell (BS-520BK manufactured by Bunkoukeiki Co., Ltd.).

Using a spectrophotometer (UV-Vis-Near-Infrared spectrophotometer JASCO-V670 manufactured by JASCO Corporation), the transmittance of light of the obtained organic photoelectric conversion element was measured; the resulting transmittance of light with a wavelength of 380 nm to 780 nm was 45%.

<Weatherability Test>

To determine the durability of the obtained organic photoelectric conversion element, a weatherability test apparatus (product name: Ci4000 manufactured by ATLAS) was operated under conditions of an irradiance of 60 W/m² (wavelength: 300 nm to 400 nm), a black panel temperature of 63° C., and a relative humidity of 50% RH to evaluate the retention ratio of the photoelectric conversion efficiency after 100 hours (the initial photoelectric conversion efficiency/the photoelectric conversion efficiency after 100 hours). The result is shown in Table 1.

Example 2

An organic photoelectric conversion element having the layer comprising a cured product obtained by curing a thermosetting resin composition with a thickness of 50 nm is manufactured in a manner similar to Example 1 except that a silver thin film (20 nm) by vapor deposition is used as the second electrode in place of the aqueous-solvent, wire-shaped conductor dispersion liquid (ClearOhm (registered trademark) Ink-N AQ). The initial photoelectric conversion efficiency and the photoelectric conversion efficiency after 100 hours is measured.

Example 3

An organic photoelectric conversion element was manufactured in a manner similar to Example 1 except that a composition in which polyhydroxyethyl methacrylate (manufactured by Aldrich) had been added to Clevios P AI4083 (manufactured by Heraeus) so as to be 50 wt % in a dried film and 0.5 wt % of Zonyl (registered trademark) FS-300 (manufactured by Aldrich) as a surfactant had been added was used in place of Clevios LVW1041 to form the layer comprising a cured product obtained by curing a thermosetting resin composition with a thickness of 40 nm; the initial photoelectric conversion efficiency and the photoelectric conversion efficiency after 100 hours were measured.

Using a spectrophotometer (UV-Vis-Near-Infrared spectrophotometer JASCO-V670 manufactured by JASCO Corporation), the transmittance of light of the obtained organic photoelectric conversion element was measured; the resulting transmittance of light with a wavelength of 380 nm to 780 nm was 45%.

Example 4

An organic photoelectric conversion element was manufactured in a manner similar to Example 1 except that a composition in which polyhydroxyethyl methacrylate (manufactured by Aldrich) had been added to Clevios P AI4083 (manufactured by Heraeus) so as to be 50 wt % in a dried film and 0.5% of Zonyl (registered trademark) FS-300 (manufactured by Aldrich) as a surfactant had been added was used in place of Clevios LVW1041 to form the layer comprising a cured product obtained by curing a thermosetting resin composition with a thickness of 40 nm and that a silver thin film (20 nm) by vapor deposition was used as the second electrode in place of the aqueous-solvent, wire-shaped conductor dispersion liquid (ClearOhm (registered trademark) Ink-N AQ); the initial photoelectric conversion efficiency and the photoelectric conversion efficiency after 100 hours were measured.

Comparative Example 1

An organic photoelectric conversion element was manufactured in a manner similar to Example 1 except that a composition in which 0.5 wt % of Zonyl (registered trademark) FS-300 (manufactured by Aldrich) had been added to Clevios P AI4083 (manufactured by Heraeus) was used in place of Clevios LVW1041 to form the layer comprising a cured product obtained by curing a thermosetting resin composition with a thickness of 40 nm and that a silver electrode with a thickness of 80 nm formed by vapor deposition was used as the second electrode; the initial photoelectric conversion efficiency and the photoelectric conversion efficiency after 100 hours were measured.

Using a spectrophotometer (UV-Vis-Near-Infrared spectrophotometer JASCO-V670 manufactured by JASCO Corporation), the transmittance of light of the obtained organic photoelectric conversion element was measured; the resulting transmittance of light with a wavelength of 380 nm to 780 nm was 0.66%.

Comparative Example 2

An organic photoelectric conversion element was manufactured in a manner similar to Example 1 except that a silver electrode with a thickness of 80 nm formed by vapor deposition was used as the second electrode; the initial efficiency and the photoelectric conversion efficiency after 100 hours were measured.

Using a spectrophotometer (UV-Vis-Near-Infrared spectrophotometer JASCO-V670 manufactured by JASCO Corporation), the transmittance of light of the obtained organic photoelectric conversion element was measured; the resulting transmittance of light with a wavelength of 380 nm to 780 nm was 0.66%.

Comparative Example 3

An organic photoelectric conversion element was manufactured in a manner similar to Example 1 except that a composition in which polyhydroxyethyl methacrylate (manufactured by Aldrich) had been added to Clevios P AI4083 (manufactured by Heraeus) so as to be 50 wt % in a dried film and 0.5% of Zonyl (registered trademark) FS-300 (manufactured by Aldrich) as a surfactant had been added was used in place of Clevios LVW1041 to form the layer comprising a cured product obtained by curing a thermosetting resin composition with a thickness of 40 nm and that a silver electrode with a thickness of 80 nm formed by vapor deposition was used as the second electrode; the initial photoelectric conversion efficiency and the photoelectric conversion efficiency after 100 hours were measured.

Using a spectrophotometer (UV-Vis-Near-Infrared spectrophotometer JASCO-V670 manufactured by JASCO Corporation), the transmittance of light of the obtained organic photoelectric conversion element was measured; the resulting transmittance of light with a wavelength of 380 nm to 780 nm was 0.66%.

Comparative Example 4

An organic photoelectric conversion element is manufactured in a manner similar to Example 1 except that a composition in which 0.5 wt % of Zonyl (registered trademark) FS-300 (manufactured by Aldrich) as a surfactant has been added to Clevios P AI4083 (manufactured by Heraeus) is used in place of Clevios LVW1041 to form the layer comprising a cured product obtained by curing a thermosetting resin composition with a thickness of 40 nm and that a silver thin film (20 nm) by vapor deposition is used as the second electrode in place of the aqueous-solvent, wire-shaped conductor dispersion liquid (ClearOhm (registered trademark) Ink-N AQ); the initial photoelectric conversion efficiency and the photoelectric conversion efficiency after 100 hours is measured.

Comparative Example 5

An organic photoelectric conversion element was manufactured in a manner similar to Example 1 except that a composition in which 0.5 wt % of Zonyl (registered trademark) FS-300 (manufactured by Aldrich) as a surfactant had been added to Clevios P AI4083 (manufactured by Heraeus) was used in place of Clevios LVW1041 to form the layer comprising a cured product obtained by curing a thermosetting resin composition with a thickness of 40 nm; the initial photoelectric conversion efficiency and the photoelectric conversion efficiency after 100 hours were measured.

Using a spectrophotometer (UV-Vis-Near-Infrared spectrophotometer JASCO-V670 manufactured by JASCO Corporation), the transmittance of light of the obtained organic photoelectric conversion element was measured; the resulting transmittance of light with a wavelength of 380 nm to 780 nm was 45%.

TABLE 1

| | Thermosetting Resin Composition | Ionization Energy Change before and after Water Rinsing Treatment (eV) | Second Electrode | Retention Ratio | Transmittance of Light with a Wavelength of 380 nm to 780 nm |
|---|---|---|---|---|---|
| Example 1 | LVW1041 (Thermosetting) | 0.05 | AgNW | 100% | 45% |
| Example 3 | AI4083 + PHEA (Thermosetting) | −0.02 | AgNW | 100% | 45% |

TABLE 1-continued

|  | Thermosetting Resin Composition | Ionization Energy Change before and after Water Rinsing Treatment (eV) | Second Electrode | Retention Ratio | Transmittance of Light with a Wavelength of 380 nm to 780 nm |
|---|---|---|---|---|---|
| Comparative Example 1 | AI4083 | −0.15 | Ag (80 nm) | 94% | 0.66% |
| Comparative Example 2 | LVW1041 (Thermosetting) | 0.05 | Ag (80 nm) | 94% | 0.66% |
| Comparative Example 3 | AI4083 + PHEA (Thermosetting) | −0.02 | Ag (80 nm) | 95% | 0.66% |
| Comparative Example 5 | AI4083 (Non-thermosetting) | −0.15 | AgNW | 89% | 45% |

It has been confirmed from Table 1 that the organic photoelectric conversion element according to the present invention has high durability.

INDUSTRIAL APPLICABILITY

According to the present invention, an organic photoelectric conversion element having high durability can be provided. In the present specification, the durability means the retention ratio of the photoelectric conversion efficiency 100 hours after the weatherability test to the initial efficiency (the initial photoelectric conversion efficiency/the photoelectric conversion efficiency after 100 hours).

The invention claimed is:

1. An organic photoelectric conversion element having an active layer between a cathode and an anode, characterized in that,
   the organic photoelectric conversion element further comprises a layer comprising a cured thermosetting resin composition between the anode and the active layer, and
   a transmittance of light with a wavelength of 380 nm to 780 nm is 10% or higher;
   wherein the thermosetting resin composition comprises one or more selected from the group consisting of polythiophene and derivatives thereof, and a polymer compound comprising a repeating unit having an aromatic amine residue;
   the active layer comprises an N-type semiconductor material and a polymer compound as a P-type semiconductor material; and
   the polymer compound as a P-type semiconductor material is a polymer compound having a structural unit represented by the following Formula (I) or Formula (II):

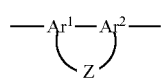
(I)

(Z-1)

(Z-2)

(Z-3)

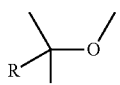
(Z-4)

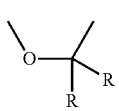
(Z-5)

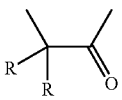
(Z-6)

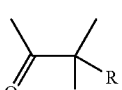
(Z-7)

wherein, in Formula (I),
$Ar^1$ and $Ar^2$ each independently represent a trivalent aromatic hydrocarbon group or a trivalent aromatic heterocyclic group,
Z represents a divalent group represented by Formula (Z-1), (Z-2), (Z-3), (Z-4), (Z-5), (Z-6), or (Z-7),
R represents a hydrogen atom, a halogen atom, an amino group, a cyano group, a monovalent aromatic hydrocarbon group optionally having a substituent, a monovalent heterocyclic group optionally having a substituent, an alkyl group optionally having a substituent, a cycloalkyl group optionally having a substituent, an alkoxy group optionally having a substituent, a cycloalkoxy group optionally having a substituent, an alkylthio group optionally having a substituent, a cycloalkylthio group optionally having a substituent, an aryloxy group optionally having a substituent, an arylthio group optionally having a substituent, an arylalkyl group optionally having a substituent, an arylalkoxy group optionally having a substituent, an arylalkylthio group optionally having a substituent, an acyl group optionally having a substituent, an acyloxy group optionally having a substituent, an amide group optionally having a substituent, an acid imide group optionally having a substituent, a substituted amino group, a substituted silyl group, a substituted silyloxy group, a substituted silylthio group, a heterocyclyloxy group, a heterocyclylthio group, an arylalkenyl group, an arylalkynyl group, or a carboxy group, and the two Rs in Formulae (Z-1), (Z-2), (Z-4), (Z-5), (Z-6), and (Z-7) may be the same as or different from each other;

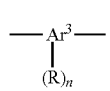
(II)

wherein, in Formula (II), $Ar^3$ represents a divalent fused polycyclic aromatic hydrocarbon group or a divalent fused polycyclic aromatic heterocyclic group having a fused ring in which two or more and five or less rings selected from the group consisting of aromatic rings and heteroaromatic rings are fused, n represents an integer of 1 to 6, R represents the same meaning as the above, and when R is plurally present, they may be the same as or different from each other.

2. The organic photoelectric conversion element according to claim 1, wherein the layer comprising a cured product obtained by curing a thermosetting resin composition has an ionization energy change before and after water rinsing treatment of −0.1 eV or higher and 0.1 eV or lower in the measurement of ionization energy before and after the following water rinsing treatment:

<Measurement of Ionization Energy before and after Water Rinsing Treatment> two films for ionization energy measurement are formed, the films for ionization energy measurement are each made by a substantially same method as that of the layer comprising a cured product obtained by curing a thermosetting resin composition using substantially same materials as those of the layer comprising a cured product obtained by curing a thermosetting resin composition of the organic photoelectric conversion element, on a one-by-one-inch square supporting substrate, the films for ionization energy measurement each have a substantially same thickness as that of the layer comprising a cured product obtained by curing a thermosetting resin composition, for one of the films for ionization energy measurement, ionization energy is measured with a photoelectron spectrometer, and an obtained value is defined as ionization energy before water rinsing treatment, water is placed on the other of the films for ionization energy measurement so as to form a meniscus, and after being left at rest for 10 seconds, spinning is performed with a spin coater at 4,000 rpm for 30 seconds to shake off the water, whereby water rinsing treatment is performed, for the film for ionization energy measurement after the water rinsing treatment, ionization energy is measured with a photoelectron spectrometer, and an obtained value is defined as ionization energy after water rinsing treatment, the value of (the ionization energy after water rinsing treatment)−(the ionization energy before water rinsing treatment) is defined as an ionization energy change before and after water rinsing treatment.

3. The organic photoelectric conversion element according to claim 1, wherein the structural units represented by Formulae (I) and (II) are a structural unit represented by the following Formula (III) and a structural unit represented by Formula (V), respectively:

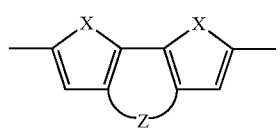
(III)

wherein, in Formula (III),

Z represents the same meaning as the above;

X represents an oxygen atom, a sulfur atom, or a selenium atom; and plurality of Xs may be the same as or different from each other;

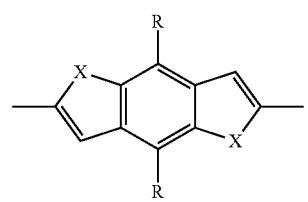
(V)

wherein, in Formula (V),

X and R represent the same meanings as the above;

plurality of Xs may be the same as or different from each other; and plurality of Rs may be the same as or different from each other.

4. The organic photoelectric conversion element according to claim 1, wherein the N-type semiconductor material has fullerene derivatives.

5. A solar cell module comprising the organic photoelectric conversion element according to claim 1.

6. A sensor comprising the organic photoelectric conversion element according to claim 1.

* * * * *